(12) United States Patent
Jang et al.

(10) Patent No.: US 11,967,533 B2
(45) Date of Patent: Apr. 23, 2024

(54) SEMICONDUCTOR DEVICES AND METHODS OF MANUFACTURING THEREOF

(71) Applicant: Taiwan Semiconductor Manufacturing Company, Ltd., Hsinchu (TW)

(72) Inventors: Shu-Uei Jang, Hsinchu (TW); Shu-Yuan Ku, Zhubei (TW); Shih-Yao Lin, New Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 161 days.

(21) Appl. No.: 17/355,444

(22) Filed: Jun. 23, 2021

(65) Prior Publication Data
US 2022/0415716 A1 Dec. 29, 2022

(51) Int. Cl.
*H01L 29/78* (2006.01)
*H01L 21/311* (2006.01)
*H01L 21/3213* (2006.01)
*H01L 21/8234* (2006.01)
*H01L 27/088* (2006.01)
*H01L 29/66* (2006.01)

(52) U.S. Cl.
CPC ........... *H01L 21/823481* (2013.01); *H01L 21/31116* (2013.01); *H01L 21/32137* (2013.01); *H01L 21/823431* (2013.01); *H01L 27/0886* (2013.01); *H01L 29/66545* (2013.01)

(58) Field of Classification Search
None
See application file for complete search history.

(56) References Cited

U.S. PATENT DOCUMENTS

2015/0311311 A1* 10/2015 Fumitake .......... H01L 29/66795
   438/587
2020/0176560 A1* 6/2020 Yu ...................... H01L 29/785

* cited by examiner

Primary Examiner — Joseph C. Nicely
Assistant Examiner — Lamont B Koo
(74) Attorney, Agent, or Firm — FOLEY & LARDNER LLP

(57) ABSTRACT

A method includes forming a first semiconductor fin and a second semiconductor fin over a substrate that both extend along a first direction. The method includes forming a dielectric fin extending along the first direction and is disposed between the first and second semiconductor fins. The method includes forming a dummy gate structure extending along a second direction and straddling the first and second semiconductor fins and the dielectric fin. The method includes removing a portion of the dummy gate structure over the dielectric fin to form a trench by performing an etching process that includes a plurality of stages. Each of the plurality of stages includes a combination of anisotropic etching and isotropic etching such that a variation of a distance between respective inner sidewalls of the trench along the second direction is within a threshold.

20 Claims, 21 Drawing Sheets

SEMICONDUCTOR DEVICES AND METHODS OF MANUFACTURING THEREOF

BACKGROUND

The present disclosure generally relates to semiconductor devices, and particularly to methods of making a non-planar transistor device.

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
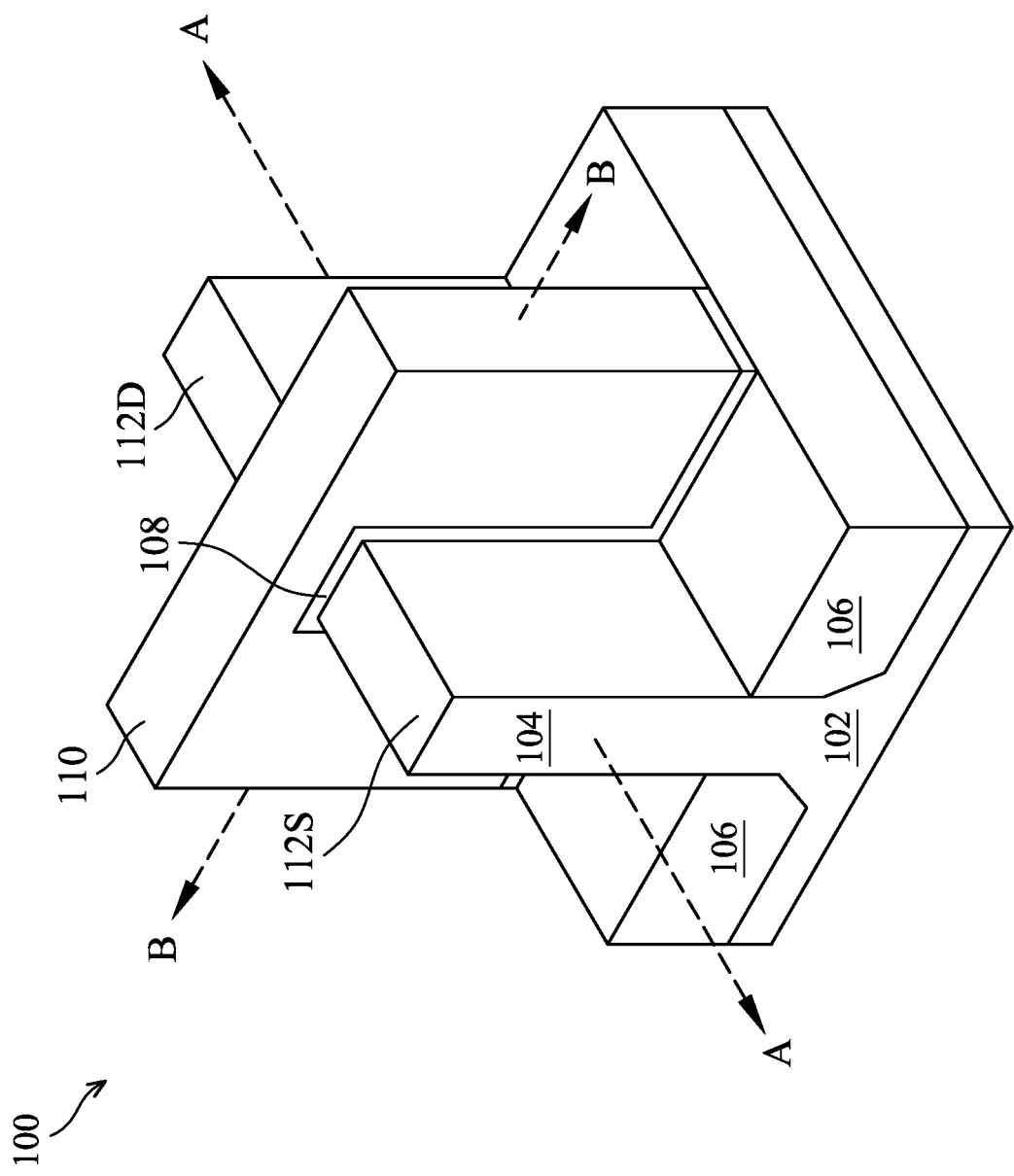
FIG. 1 illustrates a perspective view of a Fin Field-Effect Transistor (FinFET) device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of the present disclosure are discussed in the context of forming a FinFET device, and in particular, in the context of forming a replacement gate of a FinFET device. In some embodiments, a dummy gate structure is formed over a number of fins. The fins can include one or more active fins and one or more dummy fins. Hereinafter, the term "active fin" is referred to as a fin that will be adopted as an active channel to electrically conduct current in a finished semiconductor device (e.g., FinFET device 300 shown below), when appropriately configured and powered; and the term "dummy fin" is referred to as a fin that will not be adopted as an active channel (i.e., a dummy channel) to electrically conduct current in a finished semiconductor device (e.g., FinFET device 300 shown below). Next, gate spacers are formed around the dummy gate structure. After an interlayer dielectric (ILD) layer is formed around the gate spacers to overlay respective portions of the fins, a portion of the dummy gate structure over the at least one dummy fin is removed to form a gate cut trench. Next, such a gate cut trench is filled with a gate isolation structure. Next, the remaining portion of the dummy gate structure is replaced with an active gate structure, which can include one or more metal gate layers.

Metal gate layers over multiple fins formed by the above described method can provide various advantages in advanced processing nodes. The gate isolation structure is formed over the dummy fin to disconnect, intercept, cut, or otherwise separate the metal gate layers. Forming the gate isolation structure to cut metal gate layers can allow different portions of the metal gate layers to be electrically coupled to respective active fin(s).

However, the critical dimension of a gate isolation structure formed by the existing technologies may be nonuniformly enlarged, which disadvantageously shrinks respective critical dimensions of the metal gate layers. For example, due to processing variation, some of the dummy fins may be formed wider (e.g., in an area having transistors sparsely disposed) and some of the dummy fins may be formed narrower (e.g., in an area having transistors densely disposed). In general, the dimensions of the gate cut trenches formed over such different configured dummy fins vary with their dimensions accordingly. This can cause the gate cut trench over the wider dummy fin to be nonuniformly formed, partially due to its greater size. For instance, such a gate cut trench may be formed having a middle portion wider than its upper and lower portions.

The present disclosure provides various embodiments of semiconductor devices and the method of forming the same that address such an issue. In various embodiments, by tuning the conditions of a number of stages of an etching process to form gate cut trenches, even though some of the gate cut trenches are desired to be formed wider and some of the gate cut trenches are desired to be formed narrower, each of the gate cut trenches can be formed with a uniform critical dimension. For example, the etching step may be separated into a number of stages, each of which is configured to provide a respective extent of isotropic etching and/or anisotropic etching. As such, all the gate cut trenches, regardless of their respective dimensions, can be "trimmed" to be uniform.

FIG. 1 illustrates a perspective view of an example FinFET device 100, in accordance with various embodiments. The FinFET device 100 includes a substrate 102 and a fin 104 protruding above the substrate 102. Isolation regions 106 are formed on opposing sides of the fin 104, with the fin 104 protruding above the isolation regions 106. A gate dielectric 108 is along sidewalls and over a top surface of the fin 104, and a gate 110 is over the gate dielectric 108. Source region 112S and drain region 112D are in (or extended from) the fin 104 and on opposing sides of the gate dielectric 108 and the gate 110. FIG. 1 is provided as a reference to illustrate a number of cross-sections in subsequent figures. For example, cross-section B-B extends along a longitudinal axis of the gate 110 of the FinFET device 100. Cross-section A-A is perpendicular to cross-section B-B and is along a longitudinal axis of the fin 104 and in a direction of, for example, a current flow between the source/drain regions 112S/112D. Subsequent figures refer to these reference cross-sections for clarity.

Figure 2:
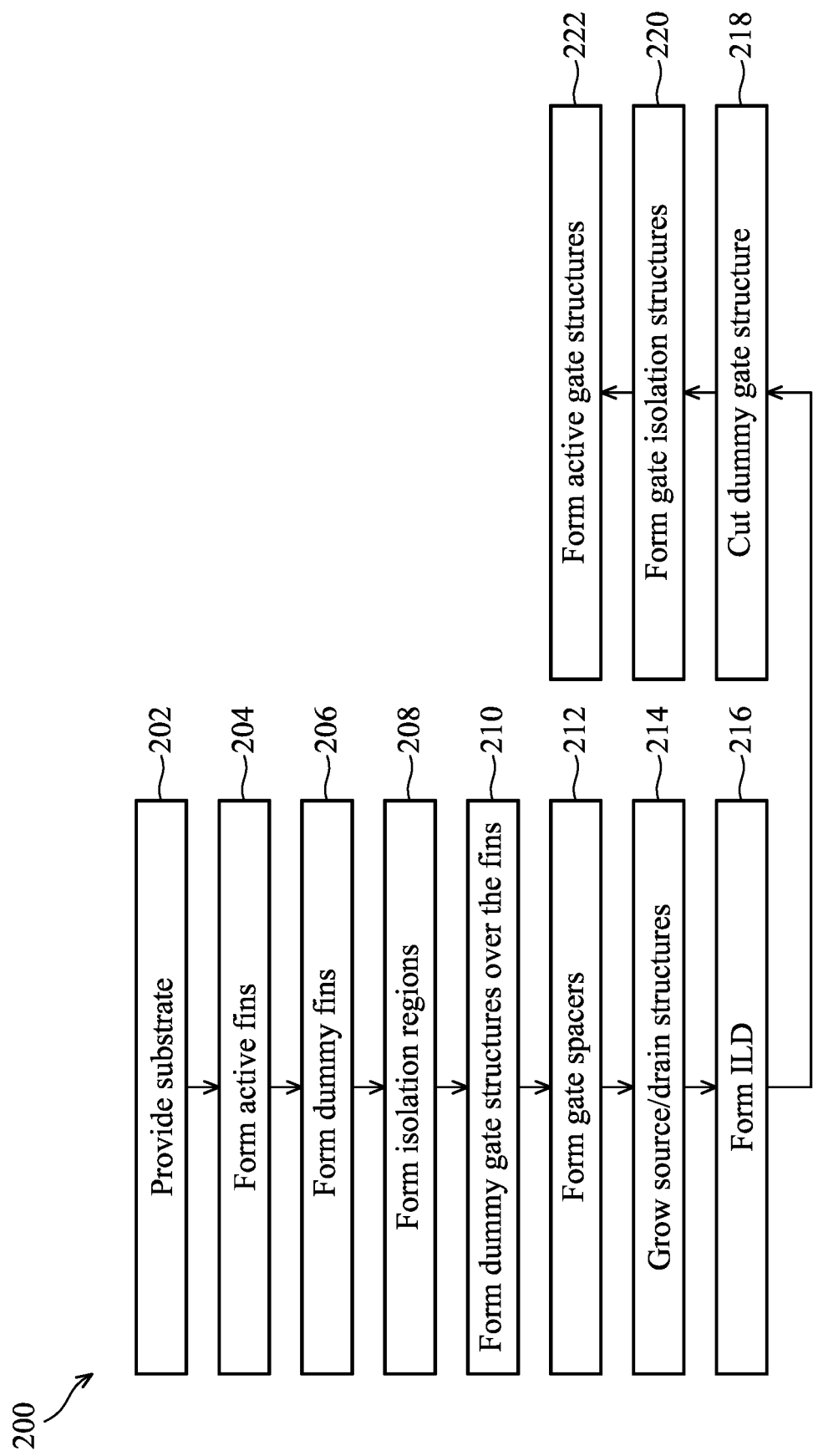
FIG. 2 illustrates a flow chart of an example method for making a non-planar transistor device, in accordance with some embodiments.

FIG. 2 illustrates a flowchart of a method 200 to form a non-planar transistor device, according to one or more embodiments of the present disclosure. For example, at least some of the operations (or steps) of the method 200 can be used to form a FinFET device (e.g., FinFET device 100), a nanosheet transistor device, a nanowire transistor device, a vertical transistor device, a gate-all-around (GAA) transistor device, or the like. It is noted that the method 200 is merely an example, and is not intended to limit the present disclosure. Accordingly, it is understood that additional operations may be provided before, during, and after the method 200 of FIG. 2, and that some other operations may only be briefly described herein. In some embodiments, operations of the method 200 may be associated with cross-sectional views of an example FinFET device at various fabrication stages as shown in FIGS. 3, 4, 5, 6, 7, 8, 9, 10, 11, 12, 13, 14, 15, 16, 17, and 18, respectively, which will be discussed in further detail below.

In brief overview, the method 200 starts with operation 202 of providing a substrate. The method 200 continues to operation 204 of forming active fins. The method 200 continues to operation 206 of forming dummy fins. The method 200 continues to operation 208 of forming isolation regions. The method 200 continues to operation 210 of forming dummy gate structures over the fins. The method 200 continues to operation 212 of forming gate spacers. The method 200 continues to operation 214 of growing source/drain structures. The method 200 continues to operation 216 of forming an interlayer dielectric (ILD). The method 200 continues to operation 218 of cutting the dummy gate structures. The method 200 continues to operation 220 of forming gate isolation structures. The method 200 continues to operation 222 of forming active gate structures.

Figure 11:
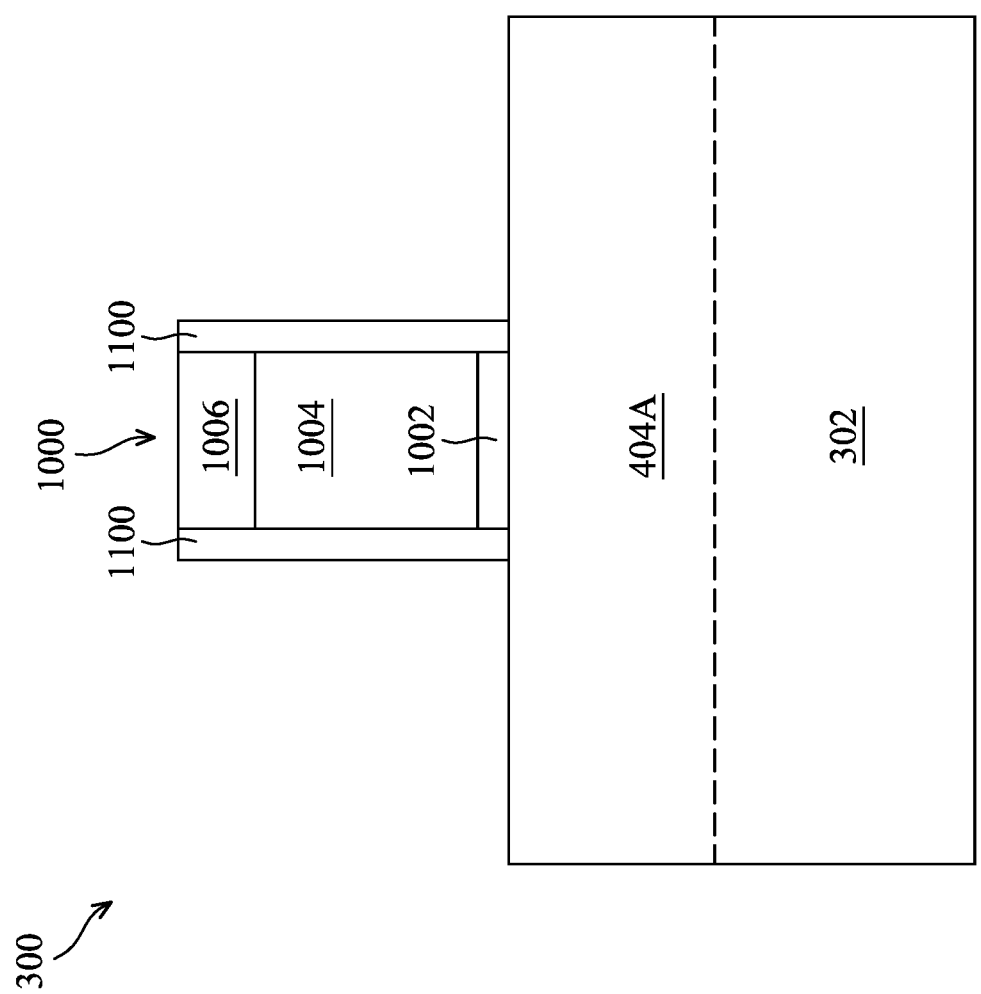
Figure 12:
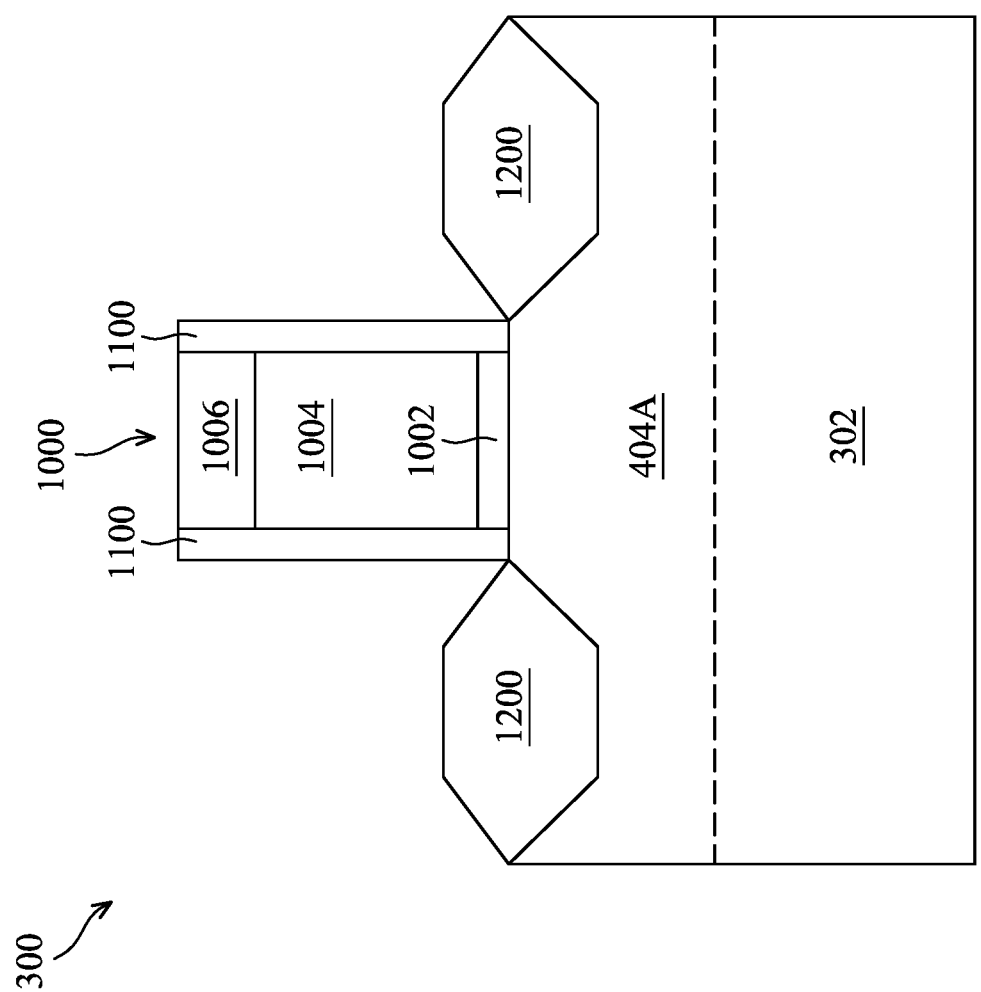
Figure 13:
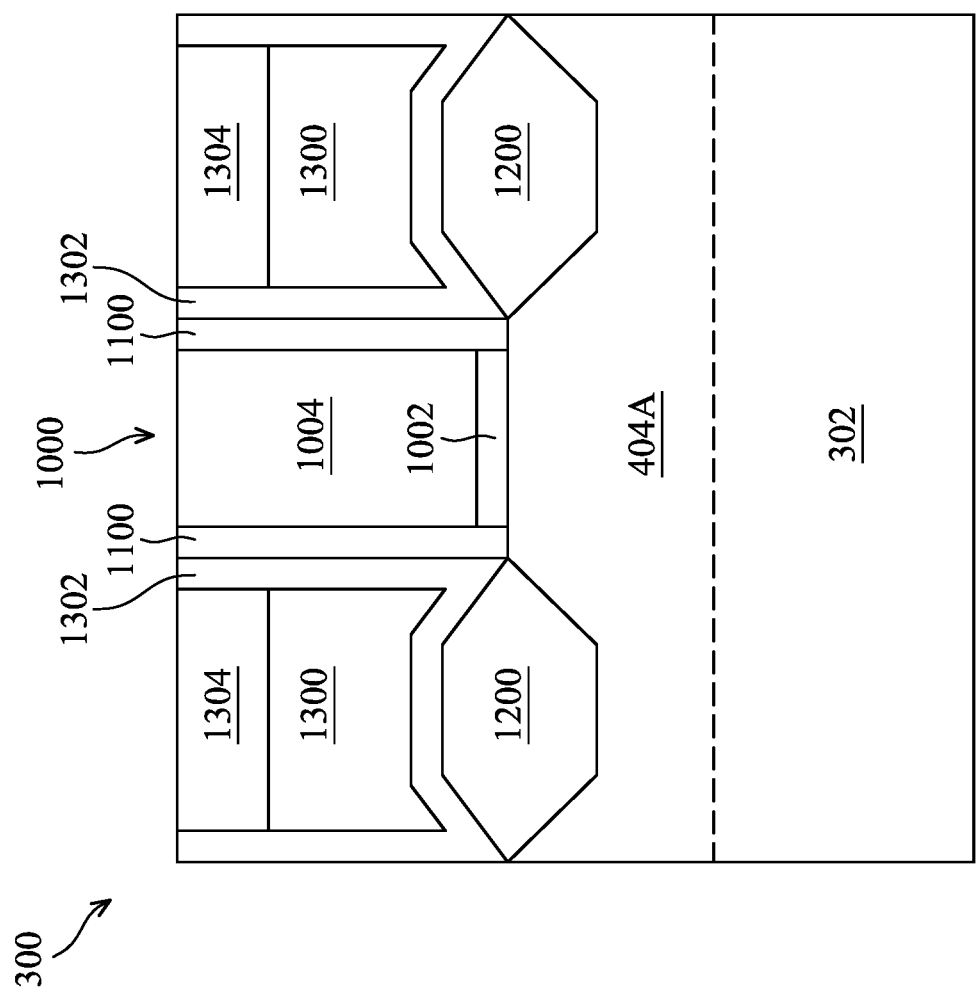

As mentioned above, FIGS. 3-18 each illustrate, in a cross-sectional view, a portion of a FinFET device 300 at various fabrication stages of the method 200 of FIG. 2. The FinFET device 300 is similar to the FinFET device 100 shown in FIG. 1, but with multiple fins. For example, FIGS. 3-10 and 14-16 illustrate cross-sectional views of the FinFET device 300 along cross-section B-B (as indicated in FIG. 1); and FIGS. 11-13 illustrate cross-sectional views of the FinFET device 300 along cross-section A-A (as indicated in FIG. 1). Although FIGS. 3-18 illustrate the FinFET device 300, it is understood the FinFET device 300 may include a number of other devices such as inductors, fuses, capacitors, coils, etc., which are not shown in FIGS. 3-18, for purposes of clarity of illustration.

Figure 3:
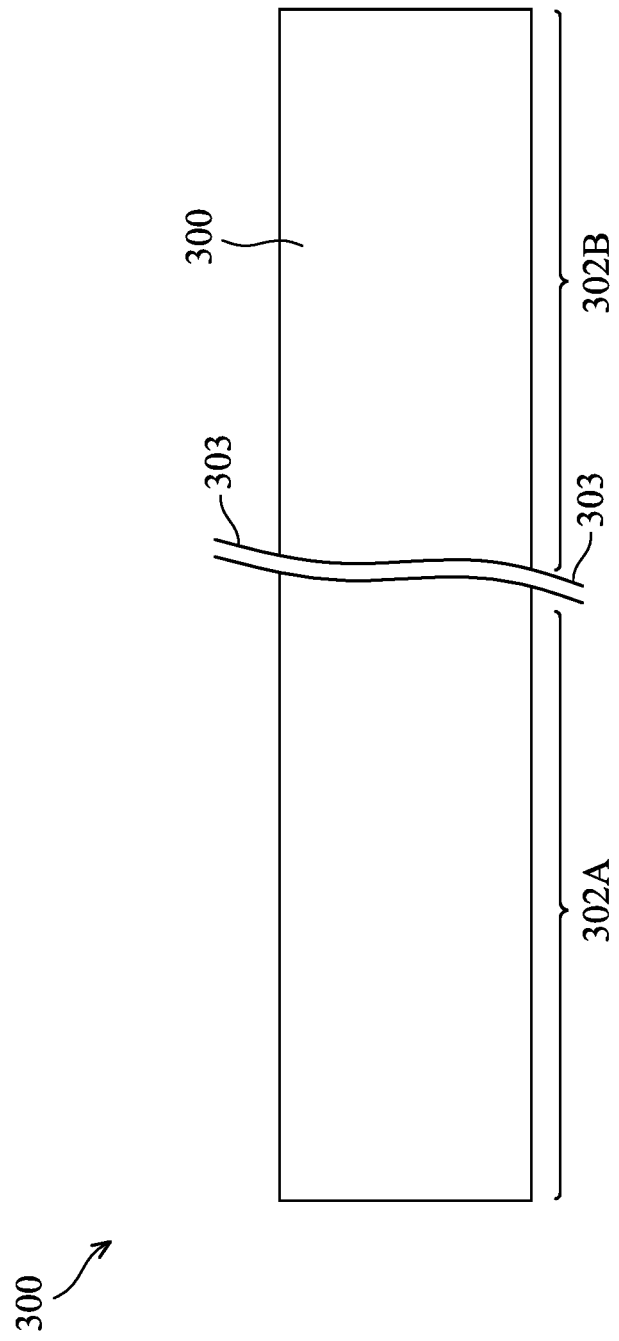
FIGS. 3, 4, 5, 6, 7, 8, 9, 10, 11, 12, 13, 14, 15, 16, 17, and 18 illustrate cross-sectional views of an example FinFET device (or a portion of the example FinFET device) during various fabrication stages, made by the method of FIG. 2, in accordance with some embodiments.

Corresponding to operation 202 of FIG. 2, FIG. 3 is a cross-sectional view of the FinFET device 300 including a semiconductor substrate 302 at one of the various stages of fabrication. The cross-sectional view of FIG. 3 is cut along the lengthwise direction of an active/dummy gate structure of the FinFET device 300 (e.g., cross-section B-B indicated in FIG. 1).

The substrate 302 may be a semiconductor substrate, such as a bulk semiconductor, a semiconductor-on-insulator (SOI) substrate, or the like, which may be doped (e.g., with a p-type or an n-type dopant) or undoped. The substrate 302 may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 302 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP, or combinations thereof.

In some embodiments, the FinFET device 300 can include areas 302A and 302B. The area 302A can be configured to form a number of input/output (I/O) transistors (hereinafter "I/O area 302A"); and the area 302B can be configured to form a number of core transistors (hereinafter "core area 302B"). The terms "I/O transistor" and "core transistor," as used herein, may be generally referred to a transistor configured to operate under a relatively higher voltage (e.g., higher $V_{gs}$) and a transistor configured to operate under a relatively lower voltage (e.g., lower $V_{gs}$), respectively. Thus, it should be understood that the I/O transistor can include any of various other transistors operating under a relatively higher voltage and the core transistor can include any of various other transistors operating under a relatively lower voltage, while remaining within the scope of the present disclosure. The I/O transistor, when appropriately configured, may have a relatively thicker gate dielectric; and the core transistor, when appropriately configured, has a relatively thinner gate dielectric. Further, the I/O transistors may be formed in a first area of the substrate (e.g., I/O area 302A) with a relatively lower density of transistors; and the core transistors may be formed in a second area of the substrate (e.g., core area 302B) with a relatively higher density of transistors. As such, features (e.g., fins) in the I/O area 302A may be more sparsely formed, when compared to the features (e.g., fins) formed in the core area 302B.

As shown in FIG. 3 (and the following figures), the I/O area 302A and core area 302B are separated from each other by a divider 303, which can include additional features/components/devices that are omitted for simplicity. It should be appreciated that some of the operations of the method 200 may be concurrently performed in the I/O area 302A and core area 302B. For purposes of illustration, some of the feature(s) formed in the I/O area 302A and the core area 302B are hereinafter shown in the same figure that corresponds to one of the operations of the method 200.

Figure 4:
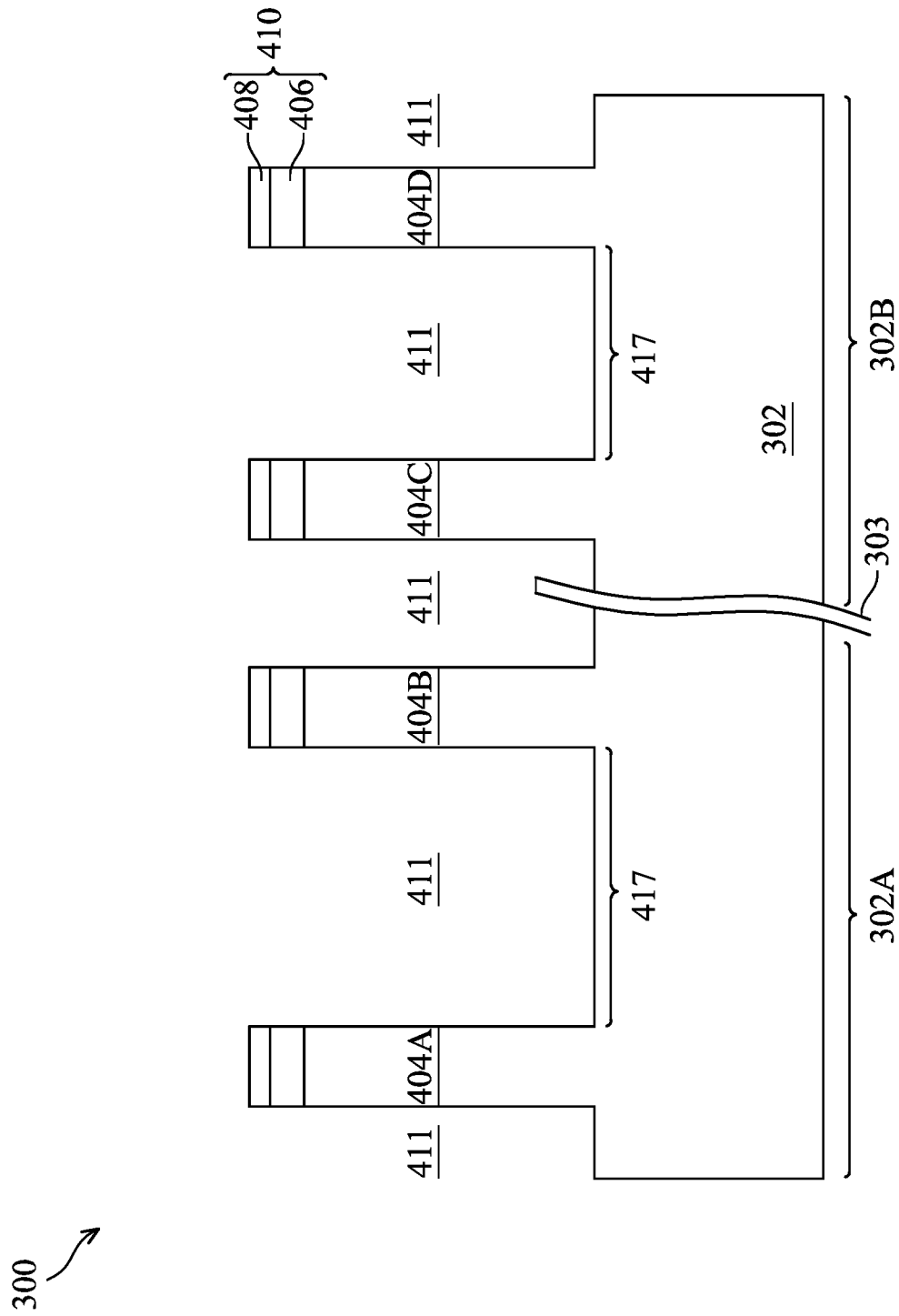

Corresponding to operation 204 of FIG. 2, FIG. 4 is a cross-sectional view of the FinFET device 300 including semiconductor fins 404A, 404B, 404C, and 404D at one of the various stages of fabrication. The cross-sectional view of FIG. 4 is cut along the lengthwise direction of an active/dummy gate structure of the FinFET device 300 (e.g., cross-section B-B indicated in FIG. 1).

The semiconductor fins 404A-B are formed in the I/O area 302A, and the semiconductor fins 404C-D are formed in the core area 302B. Although two semiconductor fins are shown in each of the I/O area 302A and core area 302B, it should be appreciated that the FinFET device 300 can include any number of semiconductor fins in each of the areas 302A and 302B while remaining within the scope of the present disclosure.

The semiconductor fins 404A-D may be each configured as an active fin, which will be adopted as an active (e.g., electrically functional) fin or channel in a completed Fin-FET. Further, the semiconductor fin 404A may be configured as the active channel of a first input/output (I/O) transistor of the FinFET device 300 (sometimes referred to as "active I/O fin 404A"); the semiconductor fin 404B may be configured as the active channel of a second input/output (I/O) transistor of the FinFET device 300 (sometimes referred to as "active I/O fin 404B"); the semiconductor fin 404C may be configured as the active channel of a first core transistor of the FinFET device 300 (sometimes referred to as "active core fin 404C"); and the fin 404D may be configured as the active channel of a second core transistor of the FinFET device 300 (sometimes referred to as "active core fin 404D").

The semiconductor fins 404A-D are formed by patterning the substrate 302 using, for example, photolithography and etching techniques. For example, a mask layer, such as a pad oxide layer 406 and an overlying pad nitride layer 408, is formed over the substrate 302. The pad oxide layer 406 may be a thin film comprising silicon oxide formed, for example, using a thermal oxidation process. The pad oxide layer 406 may act as an adhesion layer between the substrate 302 and the overlying pad nitride layer 408. In some embodiments, the pad nitride layer 408 is formed of silicon nitride, silicon oxynitride, silicon carbonitride, the like, or combinations thereof. Although only one pad nitride layer 408 is illustrated, a multilayer structure (e.g., a layer of silicon oxide on a layer of silicon nitride) may be formed as the pad nitride layer 408. The pad nitride layer 408 may be formed using low-pressure chemical vapor deposition (LPCVD) or plasma enhanced chemical vapor deposition (PECVD), for example.

The mask layer may be patterned using photolithography techniques. Generally, photolithography techniques utilize a photoresist material (not shown) that is deposited, irradiated (exposed), and developed to remove a portion of the photoresist material. The remaining photoresist material protects the underlying material, such as the mask layer in this example, from subsequent processing steps, such as etching. For example, the photoresist material is used to pattern the pad oxide layer 406 and pad nitride layer 408 to form a patterned mask 410, as illustrated in FIG. 4.

The patterned mask 410 is subsequently used to pattern exposed portions of the substrate 302 to form trenches (or openings) 411, thereby defining the active fins 404A-D between adjacent trenches 411 as illustrated in FIG. 4. When multiple fins are formed, such a trench may be disposed between any adjacent ones of the fins. In some embodiments, the active fins 404A-D are formed by etching trenches in the substrate 302 using, for example, reactive ion etch (ME), neutral beam etch (NBE), the like, or combinations thereof. The etch may be anisotropic. In some embodiments, the trenches 411 may be strips (viewed from the top) parallel to each other, and closely spaced with respect to each other. In some embodiments, the trenches 411 may be continuous and surround the active fins 404A-D.

The active fins 404A-D may be patterned by any suitable method. For example, the active fins 404A-D may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fin.

As shown in FIG. 4, the active fins 404A-B in the I/O area 302A are formed to be separated from each other with a first spacing 417, and the active fins 404C-D in the core area 302B are formed to be separated from each other with a second spacing 419. In various embodiments, the first spacing 417 can be substantially greater than the second spacing 419. For example with a certain process node (e.g., 5 nanometers), the first spacing 417 can range from about 5 nanometers to about 500 nanometers, and the second spacing 419 can range from about 5 nanometers to about 500 nanometers.

FIGS. 3 and 4 illustrate an embodiment of forming the active fins 404A-D, but a fin may be formed in various different processes. For example, a top portion of the substrate 302 may be replaced by a suitable material, such as an epitaxial material suitable for an intended type (e.g., N-type or P-type) of semiconductor devices to be formed. Thereafter, the substrate 302, with epitaxial material on top, is patterned to form the active fins 404A-D that include the epitaxial material.

As another example, a dielectric layer can be formed over a top surface of a substrate; trenches can be etched through the dielectric layer; homoepitaxial structures can be epitaxially grown in the trenches; and the dielectric layer can be recessed such that the homoepitaxial structures protrude from the dielectric layer to form one or more fins.

In yet another example, a dielectric layer can be formed over a top surface of a substrate; trenches can be etched through the dielectric layer; heteroepitaxial structures can be epitaxially grown in the trenches using a material different from the substrate; and the dielectric layer can be recessed such that the heteroepitaxial structures protrude from the dielectric layer to form one or more fins.

In embodiments where epitaxial material(s) or epitaxial structures (e.g., the heteroepitaxial structures or the homoepitaxial structures) are grown, the grown material(s) or structures may be in situ doped during growth, which may obviate prior and subsequent implantations although in situ and implantation doping may be used together. Still further, it may be advantageous to epitaxially grow a material in an NMOS region different from the material in a PMOS region. In various embodiments, the active fins 404A-D may include silicon germanium ($Si_xGe_{1-x}$, where x can be between 0 and 1), silicon carbide, pure or pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

Figure 5:
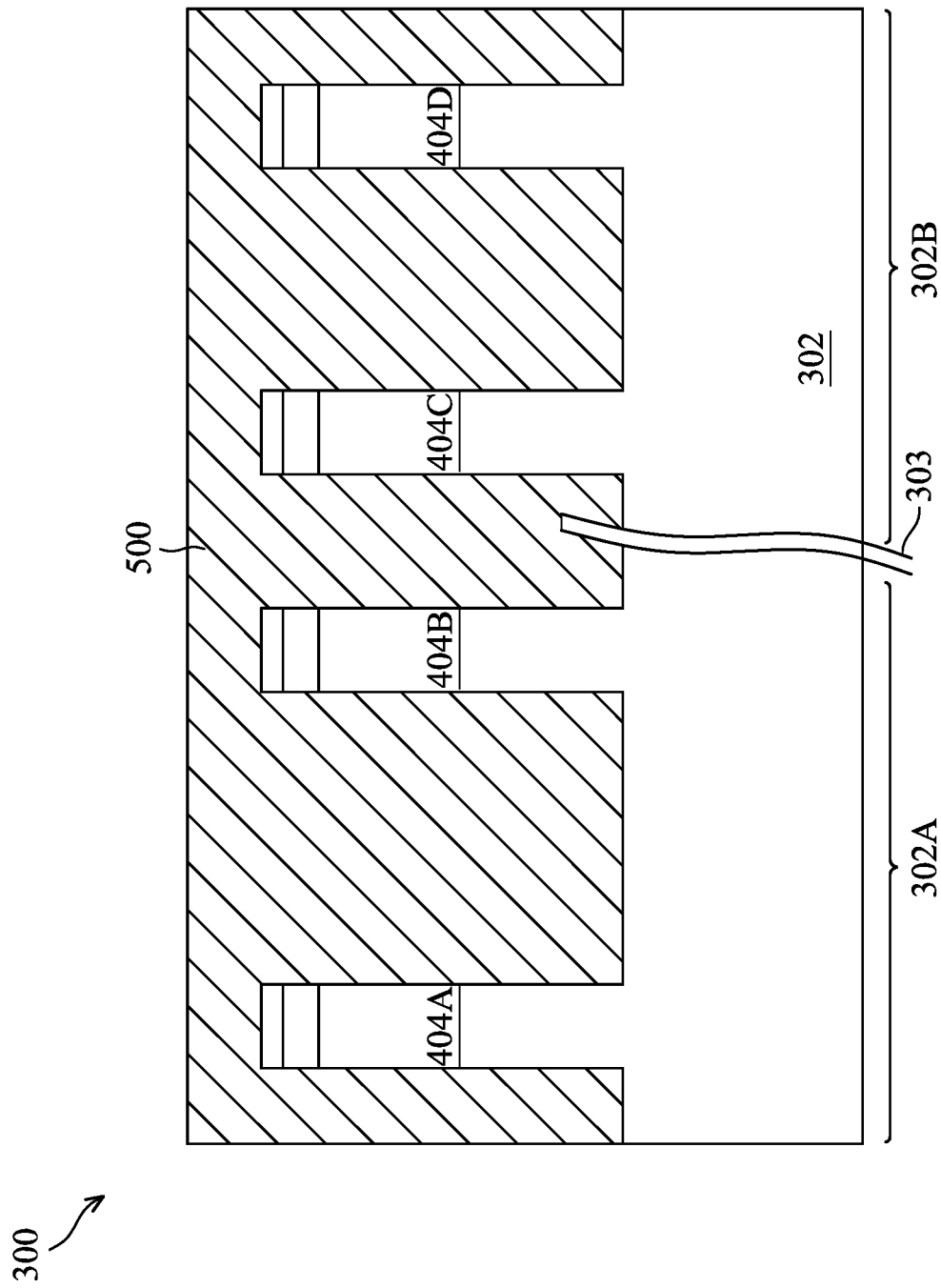
Figure 6:
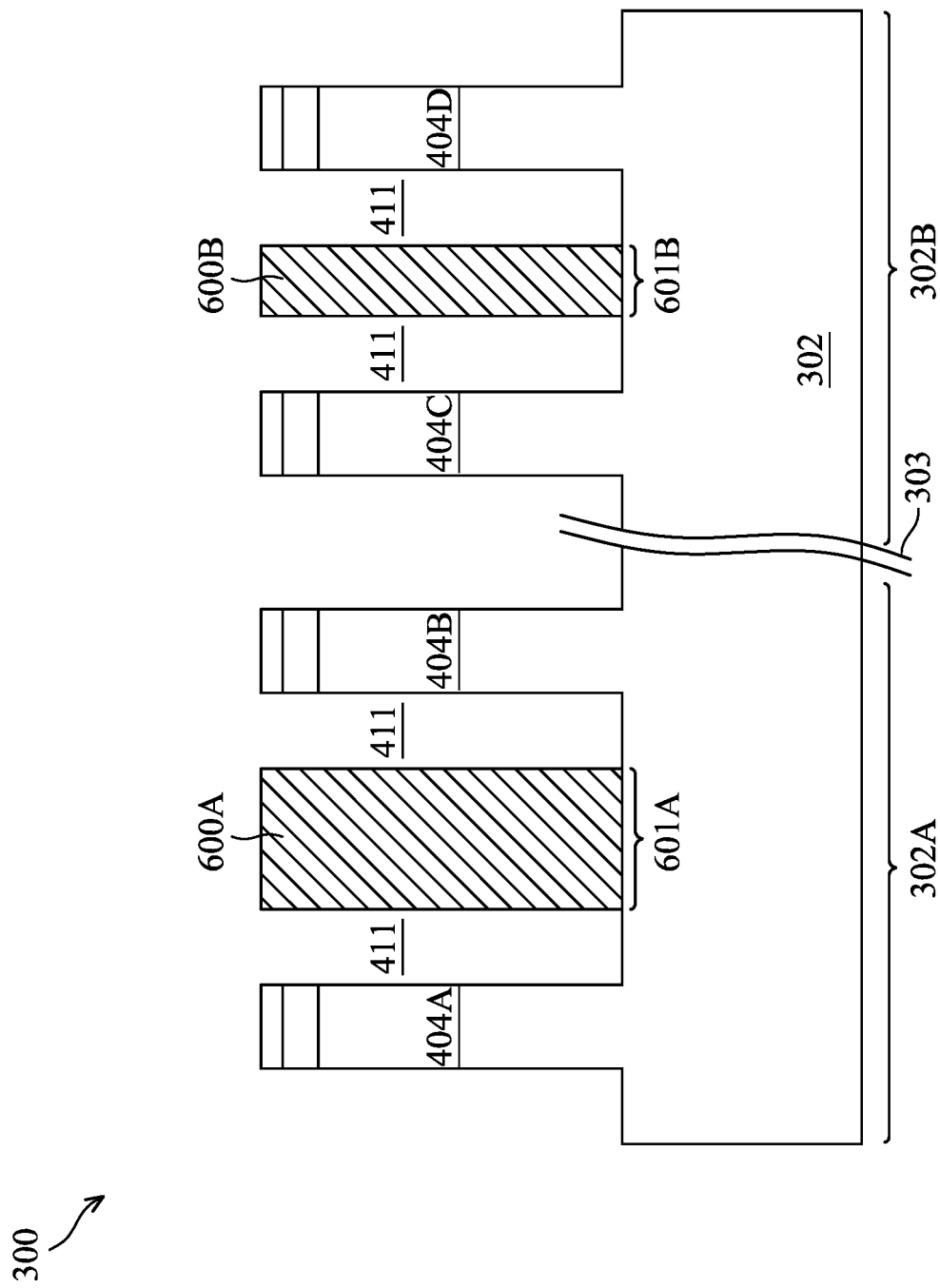

Corresponding to operation 206 of FIG. 2, FIG. 5 is a cross-sectional view of the FinFET device 300 including a dummy channel layer 500 at one of the various stages of fabrication at one of the various stages of fabrication, and FIG. 6 is a cross-sectional views of the FinFET device 300 including dummy fins 600A and 600B at one of the various stages of fabrication. The cross-sectional views of FIGS. 5 and 6 are each cut along the lengthwise direction of an active/dummy gate structure of the FinFET device 300 (e.g., cross-section B-B indicated in FIG. 1).

Although the dummy channel layer 500 is shown as being universally deposited over both of the areas 302A and 302B, it should be understood that similar dummy channel layers may be deposited over the I/O area 302A and the core area 302B, respectively.

In some embodiments, the dummy channel layer 500 can include a dielectric material used to form the dummy fins 600A-B. For example, the dielectric material may include silicon oxide, silicon nitride, silicon oxynitride, silicon carbide, silicon carbonitride, silicon oxycarbonitride, silicon oxycarbide, or combinations thereof. In another example, the dielectric material may include group IV-based oxide or group IV-based nitride, e.g., tantalum nitride, tantalum oxide, hafnium oxide, or combinations thereof. The dummy channel layer 500 may be formed using low-pressure chemical vapor deposition (LPCVD) or plasma enhanced chemical vapor deposition (PECVD), for example.

Upon depositing the dummy channel layer 500 overlaying the active fins 404A-D, one or more dummy fins, e.g., 600A and 600B, may be formed between the active fins 404A-D. For example, the dummy fin 600A may be formed between the active fins 404A-B; and the dummy fin 600B may be formed between the active fins 404C-D. The dummy fins 600A-B are formed by patterning the dummy channel layer 500 using, for example, photolithography and etching techniques. For example, a patterned mask (not shown) may be formed over the dummy channel layer 500 to mask portions of the dummy channel layer 500 to form the dummy fins 600A-B. Subsequently, unmasked portions of the dummy channel layer 500 may be etched using, for example, reactive ion etch (RIE), neutral beam etch (NBE), the like, or combinations thereof, thereby defining the dummy fins 600A-B between adjacent active fins 404A-D (or in the trenches 411) as illustrated in FIG. 6. The etch may be anisotropic, in some embodiments. In some other embodiments, the dummy fins 600A-B may be formed concurrently with or subsequently to forming isolation regions (e.g., 700 of FIG. 7) between adjacent fins, which will be discussed below.

As illustrated in FIG. 6, the dummy fin 600A formed in the I/O area 302A has a width (along a direction perpendicular to a lengthwise direction of the fins) 601A, and the dummy fin 600B formed in the core area 302B has a width (along the same direction) 601B. In various embodiments, the width 601A is substantially greater than the width 601B. For example with a certain process node (e.g., 5 nanometers), the width 601A can range from about 2 nanometers to about 200 nanometers, and the width 601B can range from about 2 nanometers to about 50 nanometers.

Figure 7:
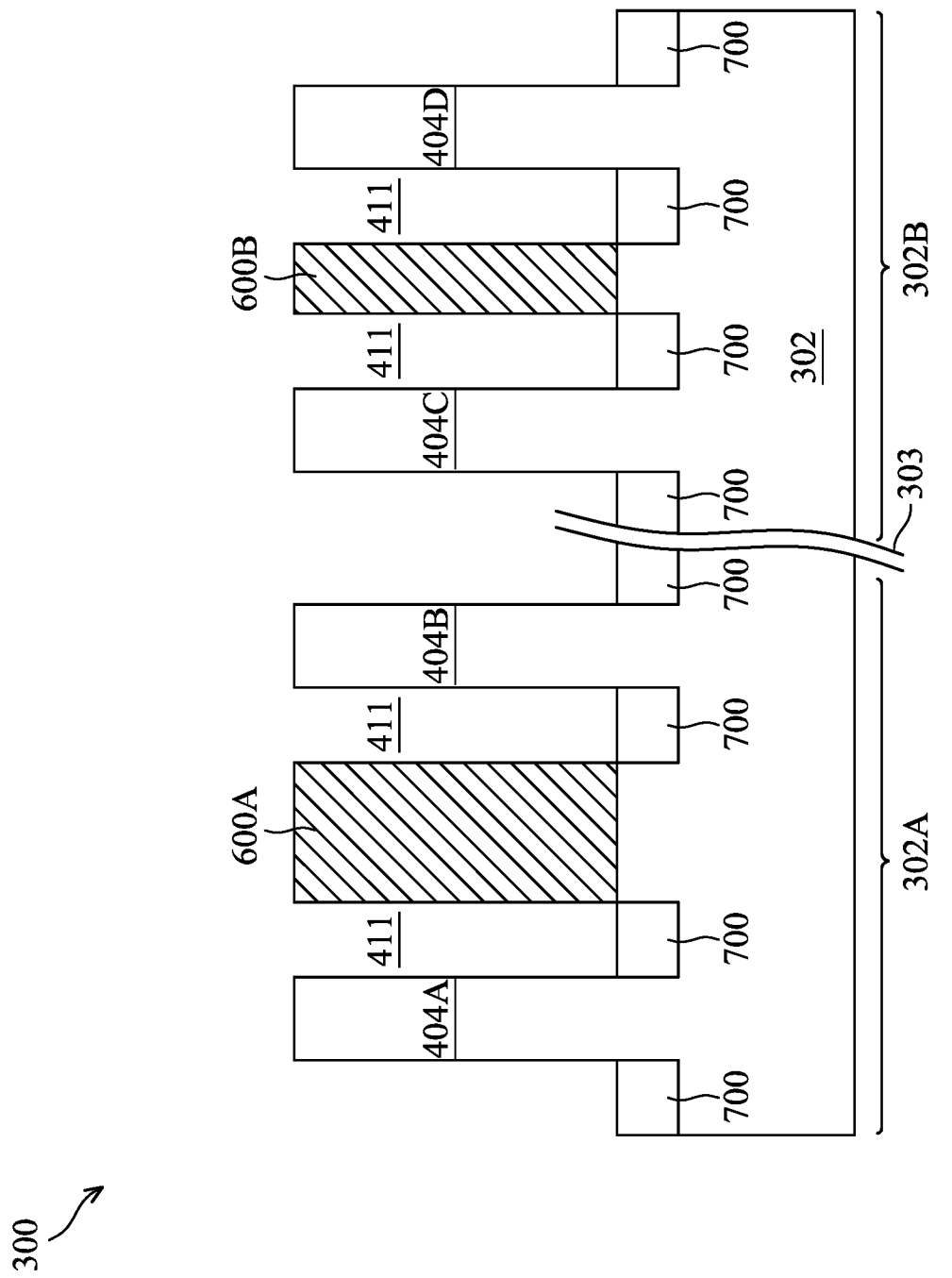

Corresponding to operation 208 of FIG. 2, FIG. 7 is a cross-sectional view of the FinFET device 300 including isolation regions 700 at one of the various stages of fabrication. The cross-sectional view of FIG. 7 is cut along the lengthwise direction of an active/dummy gate structure of the FinFET device 300 (e.g., cross-section B-B indicated in FIG. 1).

The isolation regions 700, which are formed of an insulation material, can electrically isolate neighboring fins from each other. The insulation material may be an oxide, such as silicon oxide, a nitride, the like, or combinations thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or combinations thereof. Other insulation materials and/or other formation processes may be used. In an example, the insulation material is silicon oxide formed by a FCVD process. An anneal process may be performed once the insulation material is formed. A planarization process, such as a chemical mechanical polish (CMP), may remove any excess insulation material and form top surfaces of the isolation regions 700 and a top surface of the fins 404A-D and 600A-B that are coplanar (not shown). The patterned mask 410 (FIG. 4) may also be removed by the planarization process.

In some embodiments, the isolation regions 700 include a liner, e.g., a liner oxide (not shown), at the interface between each of the isolation regions 700 and the substrate 302 (active fins 404A-D). In some embodiments, the liner oxide is formed to reduce crystalline defects at the interface between the substrate 302 and the isolation region 700. Similarly, the liner oxide may also be used to reduce crystalline defects at the interface between the active fins 404A-D and the isolation region 700. The liner oxide (e.g., silicon oxide) may be a thermal oxide formed through a thermal oxidation of a surface layer of the substrate 302, although other suitable method may also be used to form the liner oxide.

Next, the isolation regions 700 are recessed to form shallow trench isolation (STI) regions 700, as shown in FIG. 7. The isolation regions 700 are recessed such that the upper portions of the fins 404A-D and 600A-B protrude from between neighboring STI regions 700. Respective top surfaces of the STI regions 700 may have a flat surface (as illustrated), a convex surface, a concave surface (such as dishing), or combinations thereof. The top surfaces of the STI regions 700 may be formed flat, convex, and/or concave by an appropriate etch. The isolation regions 700 may be recessed using an acceptable etching process, such as one that is selective to the material of the isolation regions 700. For example, a dry etch or a wet etch using dilute hydrofluoric (DHF) acid may be performed to recess the isolation regions 700.

Figure 8:
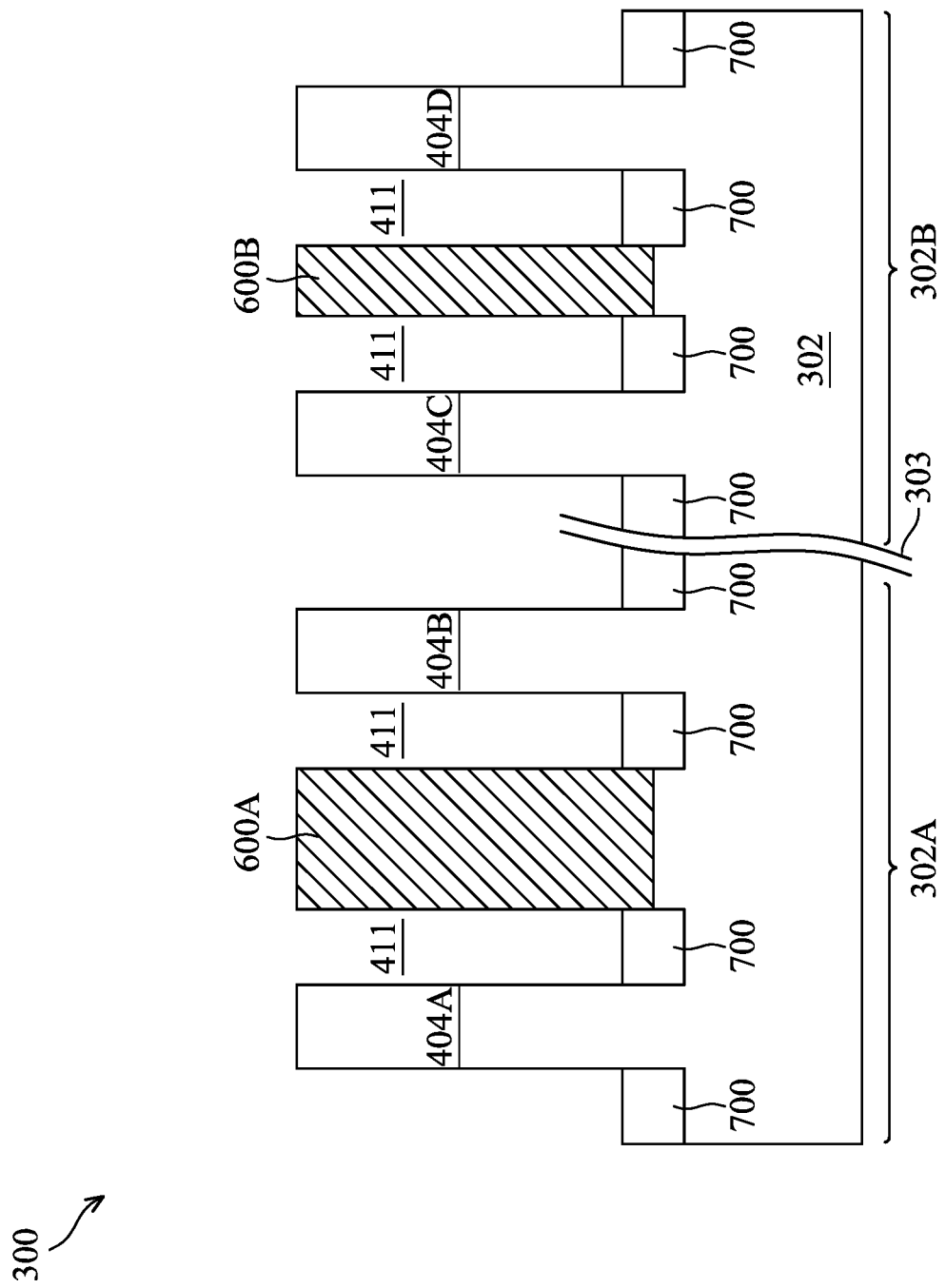

As mentioned above, the dummy fins 600A-B may be formed concurrently with or subsequently to the formation of the isolation regions 700. As an example, when forming the active fins 404A-D (FIG. 4), one or more other active fins may also be formed in the trenches 411. The insulation material of the isolation regions 700 may be deposited over the active fins, followed by a CMP process to planarize the top surfaces of the isolation regions 700 and the active fins, which include the active fins 404A-D and the active fins formed in the trenches 411. Subsequently, an upper portion of the active fins formed in the trenches 411 may be partially removed to form cavities. The cavities are then filled with the dielectric material of the dummy channel layer 500, followed by another CMP process to form the dummy fins 600A-B. The isolation regions 700 are recessed to form the shallow trench isolation (STI) regions 700, as shown in FIG. 8. Using such a method to form the dummy fins 600A-B, the dummy fins 600A-B are formed on the substrate 302 and a bottom surface of the dummy fins 600A-B is below the top surface of the isolation regions 700, as shown in FIG. 8.

Depending on how much of the isolation regions 700 is recessed, the bottom surface of the dummy fins 600A-B may be above the top surface of the isolation regions 700, while remaining within the scope of the present disclosure.

Figure 9:
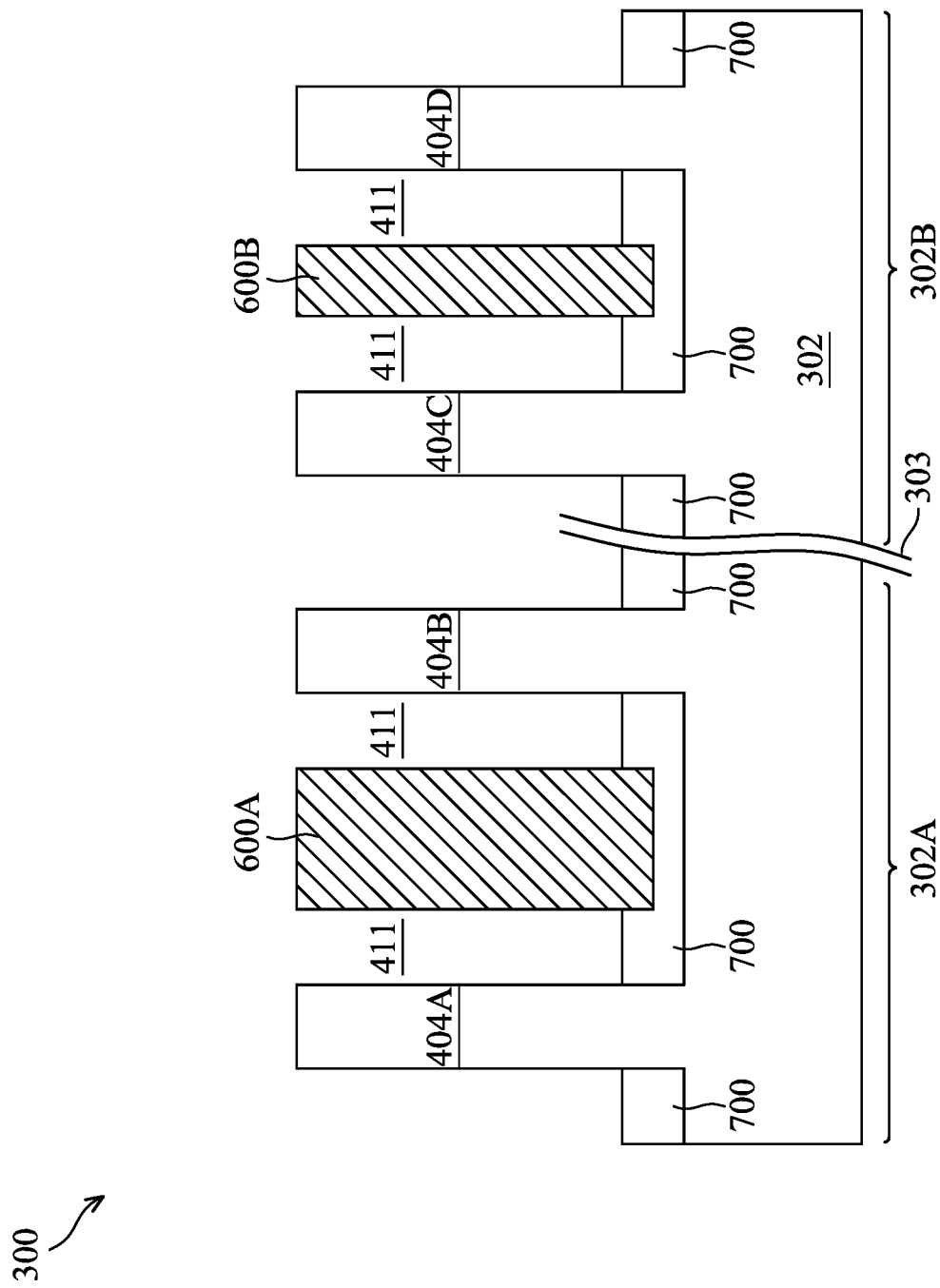

As another example, after forming the active fins 404A-D (FIG. 4), the insulation material of the isolation regions 700 may be deposited over the active fins 404A-D in a controlled deposition rate, thereby causing cavities to be spontaneously formed in the trenches 411. The cavities are then filled with the dielectric material of the dummy channel layer 500, followed by a CMP process to form the dummy fins 600A-B. The isolation regions 700 are recessed to form the shallow trench isolation (STI) regions 700, as shown in FIG. 9. Using such a method to form the dummy fins 600A-B, the dummy fins 600A-B are formed on the isolation regions 700 and a bottom surface of the dummy fins 600A-B is embedded in the corresponding isolation region 700, as shown in FIG. 9. As yet another example, after forming the active fins 404A-D (FIG. 4) and depositing the insulation material of the isolation regions 700 over the active fins 404A-D, a patterned mask may be formed over the isolation regions 700 to expose portions of the isolation regions 700 to form the dummy fins 600A-B (e.g., in the trenches 411). Subsequently, the exposed portions of the isolation regions 700 may be etched using, for example, reactive ion etch (ME), neutral beam etch (NBE), the like, or combinations thereof, thereby defining cavities. The cavities are then filled with the dielectric material of the dummy channel layer 500, followed by a CMP process to form the dummy fins 600A-B, which is similar to the illustrated embodiment of FIG. 9.

Figure 10:
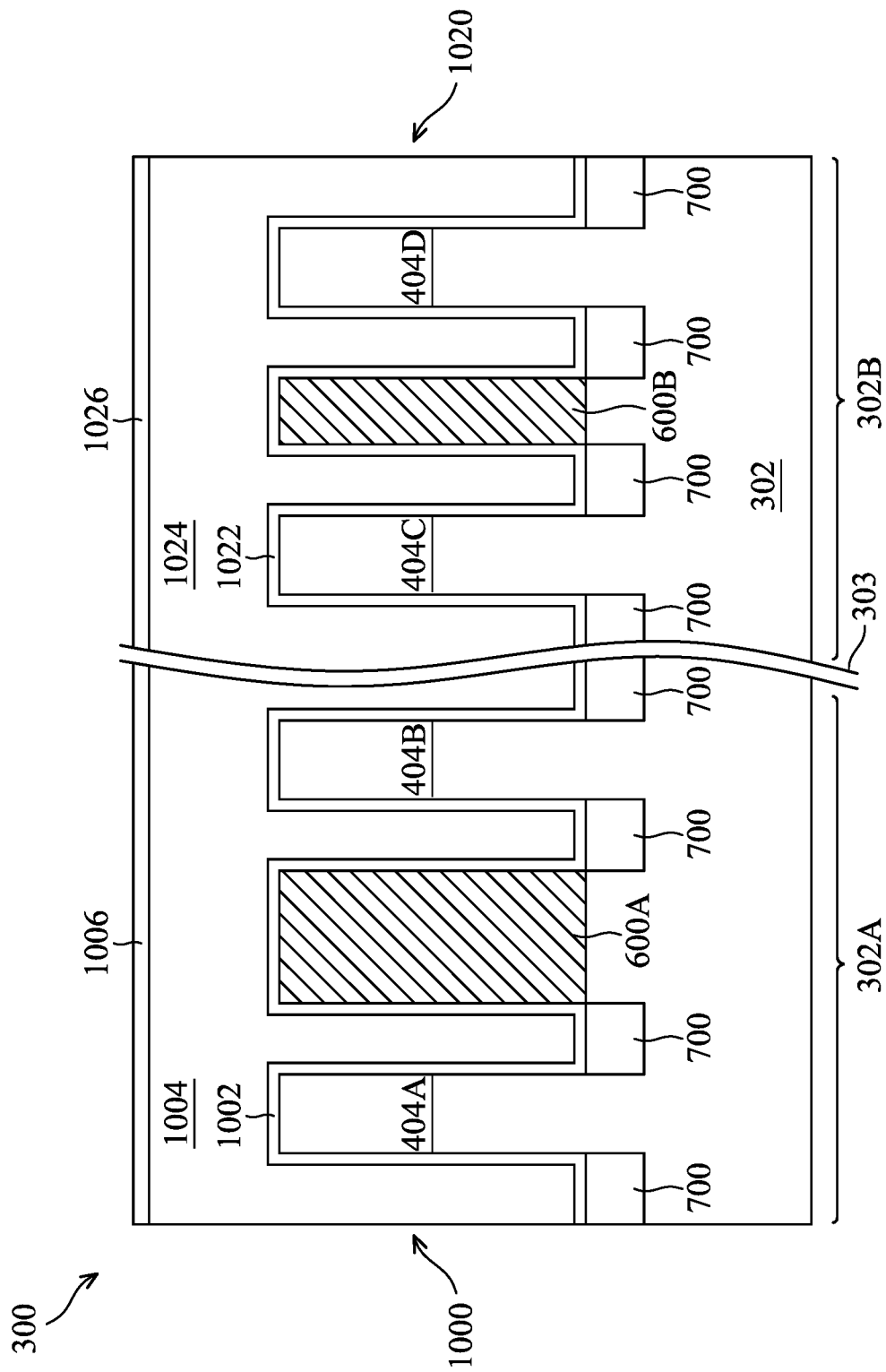

Corresponding to operation 210 of FIG. 2, FIG. 10 is a cross-sectional view of the FinFET device 300 including a dummy gate structure 1000 in the I/O area 302A and a dummy gate structure 1020 in the core area 302B at one of the various stages of fabrication. The cross-sectional view of FIG. 10 is cut along a lengthwise direction of the dummy gate structures 1000 and 1020 of the FinFET device 300 (e.g., cross-section B-B indicated in FIG. 1).

The dummy gate structure 1000 is formed to overlay a respective portion of each of the fins (e.g., active fins 400A-B, dummy fin 600A) in the core area 302B. Prior to, concurrently with, or subsequently to forming the dummy gate structure 1000 in the I/O area 302A, a dummy gate structure 1020 may be formed in the core area 302B to overlay a portion of each of the active fins 404C-D, and the dummy fin 600B. The dummy gate structure 1020 is similar to the dummy gate structure 1000, except for its dimensions, and thus, the dummy gate structure 1020 will be briefly discussed below.

The dummy gate structure 1000 includes a dummy gate dielectric 1002 and a dummy gate 1004, in some embodiments. A mask 1006 may be formed over the dummy gate structure 1000. To form the dummy gate structure 1000, a dielectric layer is formed on the active fins 404A-B and dummy fin 600A. The dielectric layer may be, for example, silicon oxide, silicon nitride, silicon oxynitride, silicon carbide, silicon carbonitride, silicon oxycarbonitride, silicon oxycarbide, multilayers thereof, or the like, and may be deposited or thermally grown. Similarly, the dummy gate structure 1020 includes a dummy gate dielectric 1022 and a dummy gate 1024, with a mask 1026 formed thereon.

A gate layer is formed over the dielectric layer, and a mask layer is formed over the gate layer. The gate layer may be deposited over the dielectric layer and then planarized, such as by a CMP. The mask layer may be deposited over the gate layer. The gate layer may be formed of, for example, polysilicon, although other materials may also be used. The mask layer may be formed of, for example, silicon nitride or the like.

After the layers (e.g., the dielectric layer, the gate layer, and the mask layer) are formed, the mask layer may be patterned using suitable lithography and etching techniques to form the mask 1006 (1026). The pattern of the mask 1006 (1026) then may be transferred to the gate layer and the dielectric layer by a suitable etching technique to form the dummy gate 1004 (1024) and the underlying dummy gate dielectric 1002 (1022), respectively. The dummy gate 1004 and the dummy gate dielectric 1002 cover a respective portion (e.g., a channel region) of each of the active fins 404A-B and the dummy fin 600A; and the dummy gate 1024 and the dummy gate dielectric 1022 cover a portion (e.g., a channel region) of the active fins 404C-D and the dummy fin 600B. The dummy gate 1004 (1024) may also have a lengthwise direction (e.g., direction B-B of FIG. 1) perpendicular to the lengthwise direction (e.g., direction of A-A of FIG. 1) of the fins.

The dummy gate dielectric 1002 is shown to be formed over the active fins 404A-b and the dummy fin 600A (e.g., over the respective top surfaces and the sidewalls of the fins) and over the STI regions 700 in the example of FIG. 10. Similarly, the dummy gate dielectric 1022 is formed to overlay the active fins 404C-D and the dummy fin 600B (e.g., overlaying the respective top surfaces and the sidewalls of the fins). In other embodiments, the dummy gate dielectric 1002 (1022) may be formed by, e.g., thermal oxidization of a material of the fins, and therefore, may be formed over the fins but not over the STI regions 700. It should be appreciated that these and other variations are still included within the scope of the present disclosure.

FIGS. 11-13 illustrate the cross-sectional views of further processing (or making) of the FinFET device 300 along cross-section A-A of one of the active fins 404A-D (as indicated in FIG. 1). As a representative example, one dummy gate structures 1000 is illustrated over the active fin 404A in FIGS. 11-13. It should be appreciated that more than one dummy gate structure can be formed over the fin 404A (and each of the other fins, e.g., 404B-D, 600A-B), while remaining within the scope of the present disclosure.

Corresponding to operation 212 of FIG. 2, FIG. 11 is a cross-sectional view of the FinFET device 300 including gate spacer 1100 formed around (e.g., along and contacting the sidewalls of) the dummy gate structure 1000. For example, the gate spacer 1100 may be formed on opposing sidewalls of the dummy gate structure 1000. It should be understood that any number of gate spacers can be formed around the dummy gate structures 1000 while remaining within the scope of the present disclosure.

The gate spacer 1100 may be a low-k spacer and may be formed of a suitable dielectric material, such as silicon oxide, silicon oxycarbonitride, or the like. Any suitable deposition method, such as thermal oxidation, chemical vapor deposition (CVD), or the like, may be used to form the gate spacer 1100. The shapes and formation methods of the gate spacer 1100 as illustrated in FIG. 11 are merely non-limiting examples, and other shapes and formation methods are possible. These and other variations are fully intended to be included within the scope of the present disclosure.

Corresponding to operation 214 of FIG. 2, FIG. 12 is a cross-sectional view of the FinFET device 300 including a number of source/drain regions 1200 at one of the various stages of fabrication. The source/drain regions 1200 are formed in recesses of the active fin 404A adjacent to the dummy gate structures 1000, e.g., between adjacent dummy gate structures 1000 and/or next to a dummy gate structure 1000. The recesses are formed by, e.g., an anisotropic etching process using the dummy gate structures 1000 as an etching mask, in some embodiments, although any other suitable etching process may also be used.

The source/drain regions 1200 are formed by epitaxially growing a semiconductor material in the recess, using suitable methods such as metal-organic CVD (MOCVD), molecular beam epitaxy (MBE), liquid phase epitaxy (LPE), vapor phase epitaxy (VPE), selective epitaxial growth (SEG), the like, or a combination thereof.

As illustrated in FIG. 12, the epitaxial source/drain structures 1200 may have surfaces raised from respective surfaces of the active fin 404A (e.g. raised above the non-recessed portions of the active fin 404A) and may have facets. In some embodiments, the source/drain structures 1200 of the adjacent fins may merge to form a continuous epitaxial source/drain structure (not shown). In some embodiments, the source/drain structures 1200 of the adjacent fins may not merge together and remain separate source/drain structures 1200 (not shown). In some embodiments, when the resulting FinFET device is an n-type FinFET, the source/drain structures 1200 can include silicon carbide (SiC), silicon phosphorous (SiP), phosphorous-doped silicon carbon (SiCP), or the like. In some embodiments, when the resulting FinFET device is a p-type FinFET, the source/drain structures 1200 comprise SiGe, and a p-type impurity such as boron or indium.

The epitaxial source/drain structures 1200 may be implanted with dopants to form source/drain structures 1200 followed by an annealing process. The implanting process may include forming and patterning masks such as a photoresist to cover the regions of the FinFET device 300 that are to be protected from the implanting process. The source/drain structures 1200 may have an impurity (e.g., dopant) concentration in a range from about $1\times10^{19}$ cm$^{-3}$ to about $1\times10^{21}$ cm$^{-3}$. P-type impurities, such as boron or indium, may be implanted in the source/drain structures 1200 of a P-type transistor. N-type impurities, such as phosphorous or arsenide, may be implanted in the source/drain structures 1200 of an N-type transistor. In some embodiments, the epitaxial source/drain structures 1200 may be in situ doped during their growth.

Corresponding to operation 216 of FIG. 2, FIG. 13 is a cross-sectional view of the FinFET device 300 including an interlayer dielectric (ILD) 1300 at one of the various stages of fabrication. In some embodiments, prior to forming the ILD 1300, a contact etch stop layer (CESL) 1302 is formed over the structure, as illustrated in FIG. 13. The CESL 1302 can function as an etch stop layer in a subsequent etching process, and may comprise a suitable material such as silicon oxide, silicon nitride, silicon oxynitride, combinations thereof, or the like, and may be formed by a suitable formation method such as CVD, PVD, combinations thereof, or the like.

Next, the ILD 1300 is formed over the CESL 1302 and over the dummy gate structures 1000. In some embodiments, the ILD 1300 is formed of a dielectric material such as silicon oxide, phosphosilicate glass (PSG), borosilicate glass (BSG), boron-doped phosphosilicate Glass (BPSG), undoped silicate glass (USG), or the like, and may be deposited by any suitable method, such as CVD, PECVD, or FCVD. After the ILD 1300 is formed, an optional dielectric layer 1304 is formed over the ILD 1300. The dielectric layer 1304 can function as a protection layer to prevent or reduces the loss of the ILD 1300 in subsequent etching processes. The dielectric layer 1304 may be formed of a suitable material, such as silicon nitride, silicon carbonitride, or the like, using a suitable method such as CVD, PECVD, or FCVD. After the dielectric layer 1304 is formed, a planarization process, such as a CMP process, may be performed to achieve a level upper surface for the dielectric layer 1304. The CMP may also remove the mask 1006 and portions of the CESL 1302 disposed over the dummy gate 1004 (FIG. 12). After the planarization process, the upper surface of the dielectric layer 1304 is level with the upper surface of the dummy gate 1004, in some embodiments.

Figure 14:
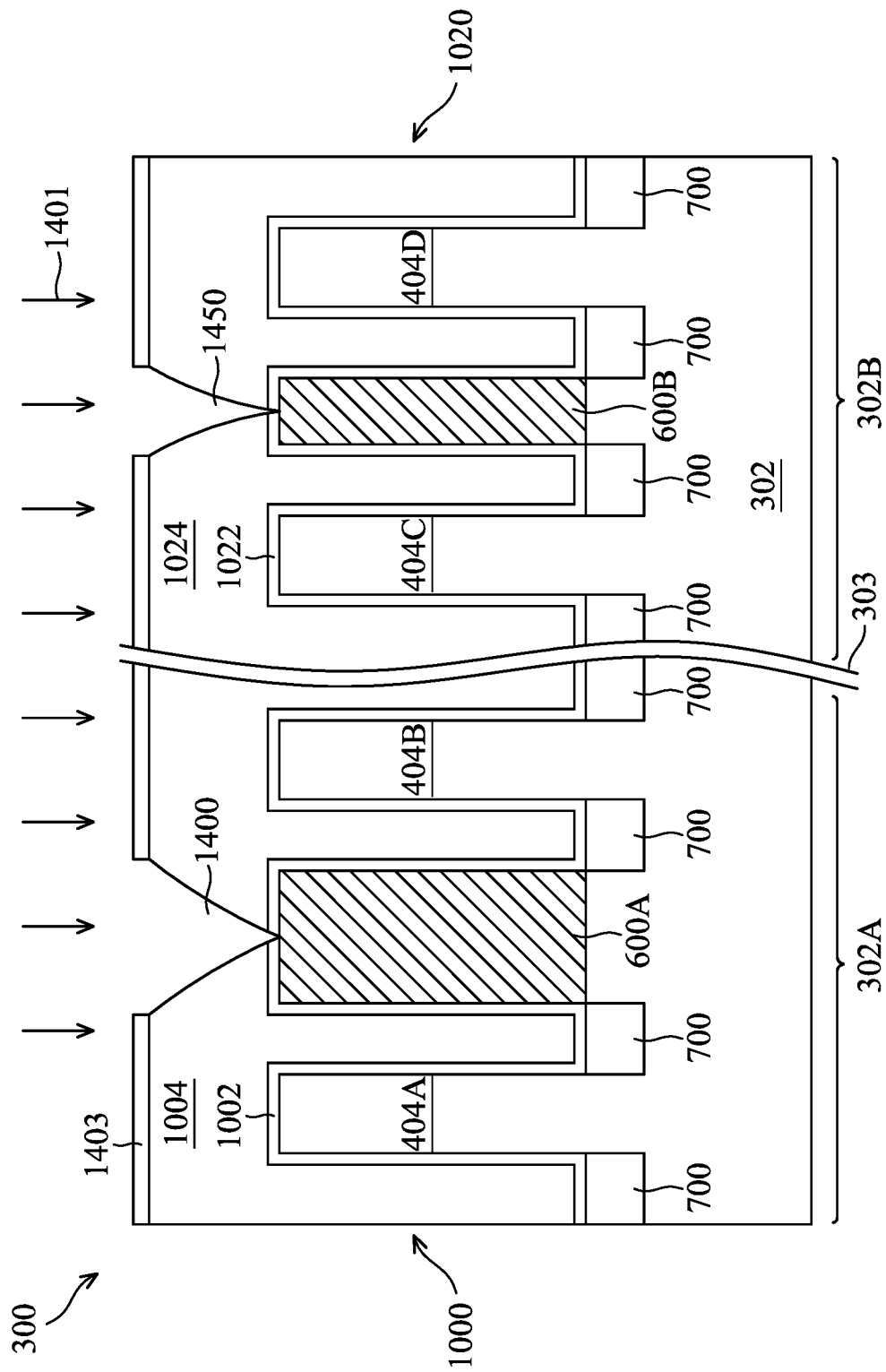

Corresponding to operation 218 of FIG. 2, FIG. 14 is a cross-sectional view of the FinFET device 300 in which the dummy gate structures 1000 and 1020 are respectively cut, intercepted, or otherwise disconnected to form a first portion of a gate cut trench 1400 in the I/O area 302A and a first portion of a gate cut trench 1450 in the core area 302B at one of the various stages of fabrication. The cross-sectional view of FIG. 14 is cut along the lengthwise direction of the dummy gate structures 1000 and 1020 of the FinFET device 300 (e.g., cross-section B-B indicated in FIG. 1).

To form the first portion of gate cut trench 1400 (hereinafter "first portion 1400"), a first stage of etching process 1401 (hereinafter "first stage 1401") may be performed to remove a portion of the dummy gate 1004 and a portion of the dummy gate dielectric 1002 that are disposed above the dummy fin 600A. Concurrently with forming the first portion 1400, the first stage 1401 may be performed to remove a portion of the dummy gate 1024 and a portion of the dummy gate dielectric 1022 that are disposed above the dummy fin 600B. During the first stage 1401, a mask 1403 may be formed over the dummy gate structures 1000 and 1020 to expose respective portions of the dummy gates 1004 and 1024 desired to be removed (e.g., the portion disposed over the dummy fins 600A-B), followed by the first stage 1401. The mask 1403 may be continued to be used during the following stages of etching process.

In various embodiments, the first stage 1401 (of etching process) may be characterized with more anisotropic etching than isotropic etching. In other words, the first stage 1401 can vertically (or along a certain direction) etch the dummy gate structures 1000 and 1020 more quickly than it laterally etches the dummy gate structures 1000 and 1020. As such, the first portions 1400 and 1450 may each present a valley-shaped profile, as illustrated in FIG. 14. In some embodiments, the dummy fins 600A and 600B may each serve as an etch stop layer, which causes an edge of the valley-shaped profile to present around top surfaces of the dummy fins 600A-B (as shown). In some other embodiments, the dummy gate dielectrics 1002 and 1022 may each serve as an etch stop layer, which causes the edge of the valley-shaped profile to present around top surfaces of the dummy gate dielectrics 1002-1022 (not shown).

The first stage 1401 can include a plasma etching process. In such a plasma etching process (including radical plasma etching, remote plasma etching, and other suitable plasma etching processes), gas sources such as chlorine ($Cl_2$), hydrogen bromide (HBr), carbon tetrafluoride ($CF_4$), fluoroform ($CHF_3$), difluoromethane ($CH_2F_2$), fluoromethane ($CH_3F$), hexafluoro-1,3-butadiene ($C_4F_6$), boron trichloride ($BCl_3$), sulfur hexafluoride ($SF_6$), hydrogen ($H_2$), nitrogen trifluoride ($NF_3$), and other suitable gas sources and combinations thereof can be used with passivation gases such as nitrogen ($N_2$), oxygen ($O_2$), carbon dioxide ($CO_2$), sulfur dioxide ($SO_2$), carbon monoxide (CO), methane ($CH_4$), silicon tetrachloride ($SiCl_4$), and other suitable passivation gases and combinations thereof. Moreover, for the plasma etching process, the gas sources and/or the passivation gases can be diluted with gases such as argon (Ar), helium (He), neon (Ne), and other suitable dilutive gases and combinations thereof.

Figure 19:
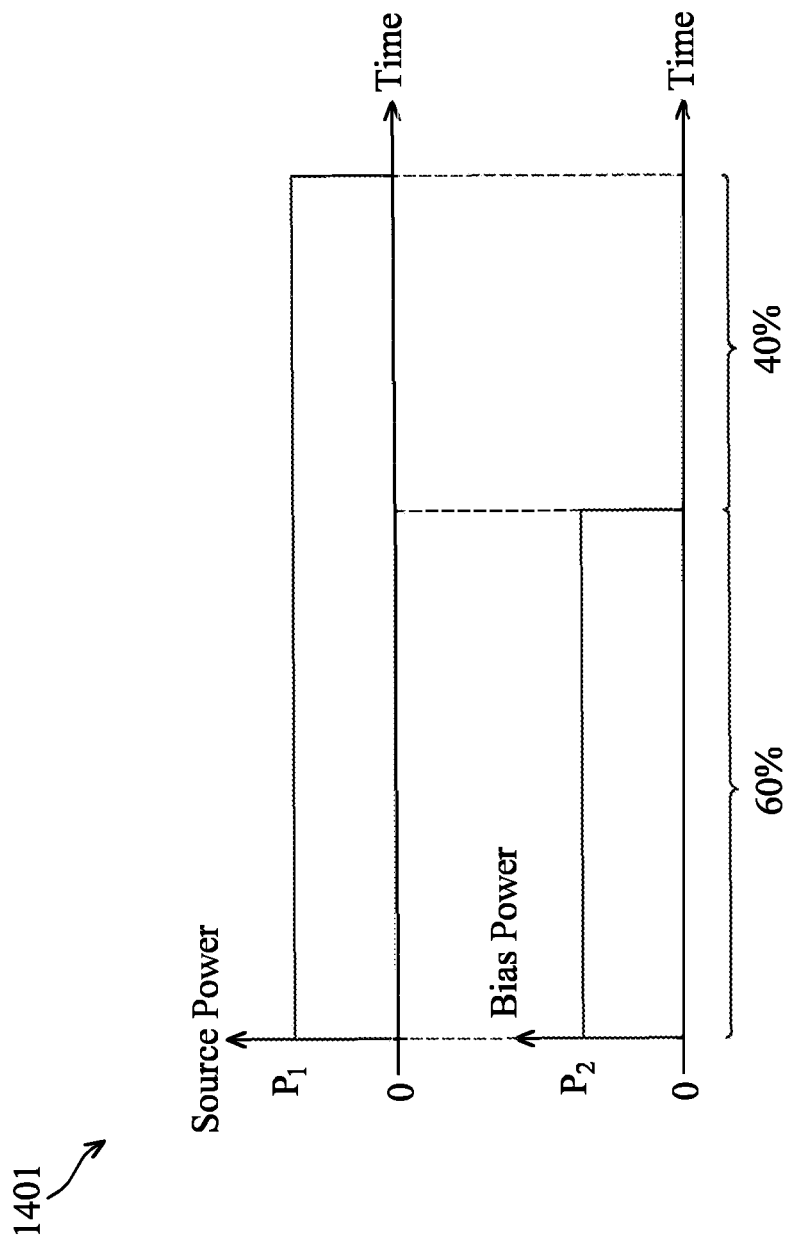
FIG. 19 illustrates an example timing diagram of one stage of an etching process performed in the method of FIG. 2, in accordance with some embodiments.

As a non-limiting example shown in FIG. 19, a timing diagram of the first stage 1401 is shown. In the first stage 1401, a source power $P_1$ (e.g., ranging from about 500 watts to about 800 watts) and a bias power $P_2$ (e.g., ranging from about 200 watts to 300 watts) may be applied during the first 60% of the first stage 1401, under a pressure of 1 millitorr to 5 torr and an etch gas flow of 0 standard cubic centimeters per minute to 5000 standard cubic centimeters per minute. For the rest 40% of the first stage 1401, while the source power $P_1$ may be kept constant, the bias power may be reduced to about 0 watts. As such, during the first 60%, the first stage 1401 may present a higher amount/extent of the anisotropic etching, and during the rest 40%, the amount of anisotropic etching may be reduced to be comparable with an amount of the isotropic etching. However, it is noted that source powers (and their applied time durations), bias powers (and their applied time durations), pressures, and flow rates outside of these ranges can also be contemplated, while remaining within the scope of the present disclosure.

Figure 15:
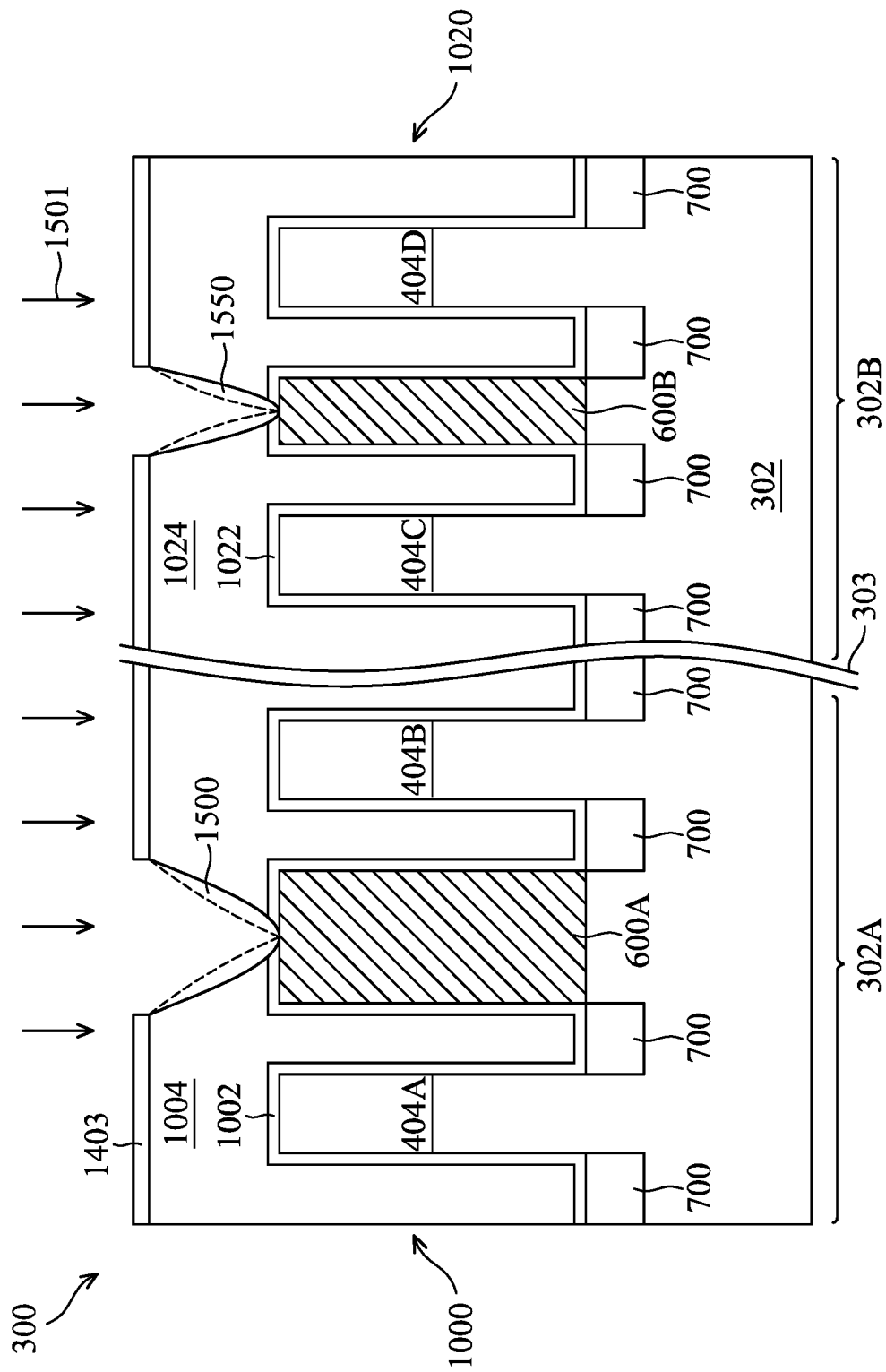

Still corresponding to operation 218 of FIG. 2, FIG. 15 is a cross-sectional view of the FinFET device 300 in which the dummy gate structures 1000 and 1020 are further cut to form a second portion of the gate cut trench 1500 in the I/O area 302A and a second portion of the gate cut trench 1550 in the core area 302B, respectively, at one of the various stages of fabrication.

To form the second portion of gate cut trench 1500 (hereinafter "second portion 1500"), a second stage of etching process 1501 (hereinafter "second stage 1501") may be performed to remove a portion of the dummy gate 1004 and a portion of the dummy gate dielectric 1002 that are disposed above the dummy fin 600A. Concurrently with forming the second portion 1500, the second stage 1501 may be performed to remove a portion of the dummy gate 1024 and a portion of the dummy gate dielectric 1022 that are disposed above the dummy fin 600B. During the second stage 1501, the mask 1403 may still be used to expose the respective portions of the dummy gates 1004 and 1024 desired to be removed (e.g., the portion disposed over the dummy fins 600A-B), followed by the second stage 1501.

In various embodiments, the second stage 1501 (of etching process) may be characterized with a mixture of anisotropic etching and isotropic etching. In other words, the second stage 1501 can vertically (or along a certain direction) etch the dummy gate structures 1000 and 1020 while laterally etching the dummy gate structures 1000 and 1020. As such, the second portions 1500 and 1550 may each extend the respective first portion (indicated by dotted lines) to present a U-shaped profile with a curvature-based bottom surface, as illustrated in FIG. 15. In some embodiments, the dummy fins 600A and 600B may each serve as an etch stop layer, which causes the curvature-based bottom surface of the U-shaped profile to present around the top surfaces of the dummy fins 600A-B (as shown). In some other embodiments, the dummy gate dielectrics 1002 and 1022 may each serve as an etch stop layer, which causes the curvature-based bottom surface of the U-shaped profile to present around the top surfaces of the dummy gate dielectrics 1002-1022 (not shown).

The second stage 1501 can include a plasma etching process. In such a plasma etching process (including radical plasma etching, remote plasma etching, and other suitable plasma etching processes), gas sources such as chlorine ($Cl_2$), hydrogen bromide (HBr), carbon tetrafluoride ($CF_4$), fluoroform ($CHF_3$), difluoromethane ($CH_2F_2$), fluoromethane ($CH_3F$), hexafluoro-1,3-butadiene ($C_4F_6$), boron trichloride ($BCl_3$), sulfur hexafluoride ($SF_6$), hydrogen ($H_2$), nitrogen trifluoride ($NF_3$), and other suitable gas sources and combinations thereof can be used with passivation gases such as nitrogen ($N_2$), oxygen ($O_2$), carbon dioxide ($CO_2$), sulfur dioxide ($SO_2$), carbon monoxide (CO), methane ($CH_4$), silicon tetrachloride ($SiCl_4$), and other suitable passivation gases and combinations thereof. Moreover, for the plasma etching process, the gas sources and/or the passivation gases can be diluted with gases such as argon (Ar), helium (He), neon (Ne), and other suitable dilutive gases and combinations thereof.

Figure 20:
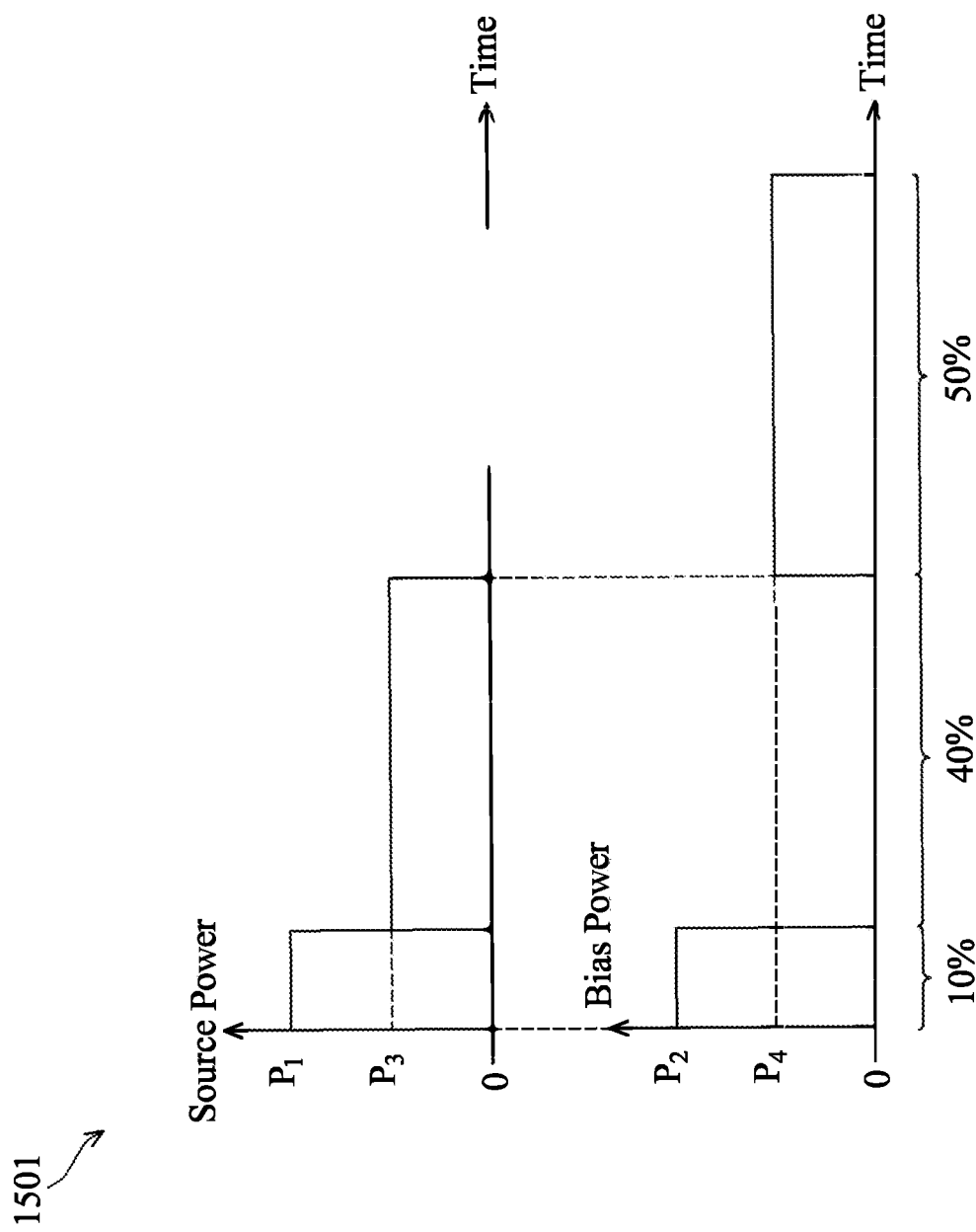
FIG. 20 illustrates an example timing diagram of another stage of the etching process performed in the method of FIG. 2, in accordance with some embodiments

As a non-limiting example shown in FIG. 20, a timing diagram of the second stage 1501 is shown. In the second stage 1501, a source power $P_1$ (e.g., ranging from about 800 watts to about 1200 watts) and a bias power $P_2$ (e.g., ranging from about 200 watts to 300 watts) may be applied during the first 10% of the second stage 1501, under a pressure of 1 millitorr to 5 torr and an etch gas flow of 0 standard cubic centimeters per minute to 5000 standard cubic centimeters per minute. For the next 40% of the second stage 1501, the source power may be reduced to $P_3$ (e.g., ranging from about 120 watts to 160 watts), and the bias power may be reduced to about 0 watts. For the rest 50% of the second stage 1501, the source power is reduced to about 0 watts, and the bias power is increased to $P_4$, which ranges from about 80 watts to about 100 watts. As such, after the first 10% (the next 40%), the second stage 1501 may present a higher amount/extent of the isotropic etching than an amount of the anisotropic etching, which may result from a relatively high amount of radicals. During the rest 50%, the second stage 1501 may present a higher amount of the anisotropic etching than an amount of the isotropic etching. For example, in the rest 50%, the radicals can be pulled along a certain direction (e.g., a vertical direction) to further etch the valley-shaped first portion 1400/1450 to present the U-shaped profile of second portion 1500/1550. However, it is noted that source powers (and their applied time durations), bias powers, pressures (and their applied time durations), and flow rates outside of these ranges can also be contemplated, while remaining within the scope of the present disclosure.

Figure 16:
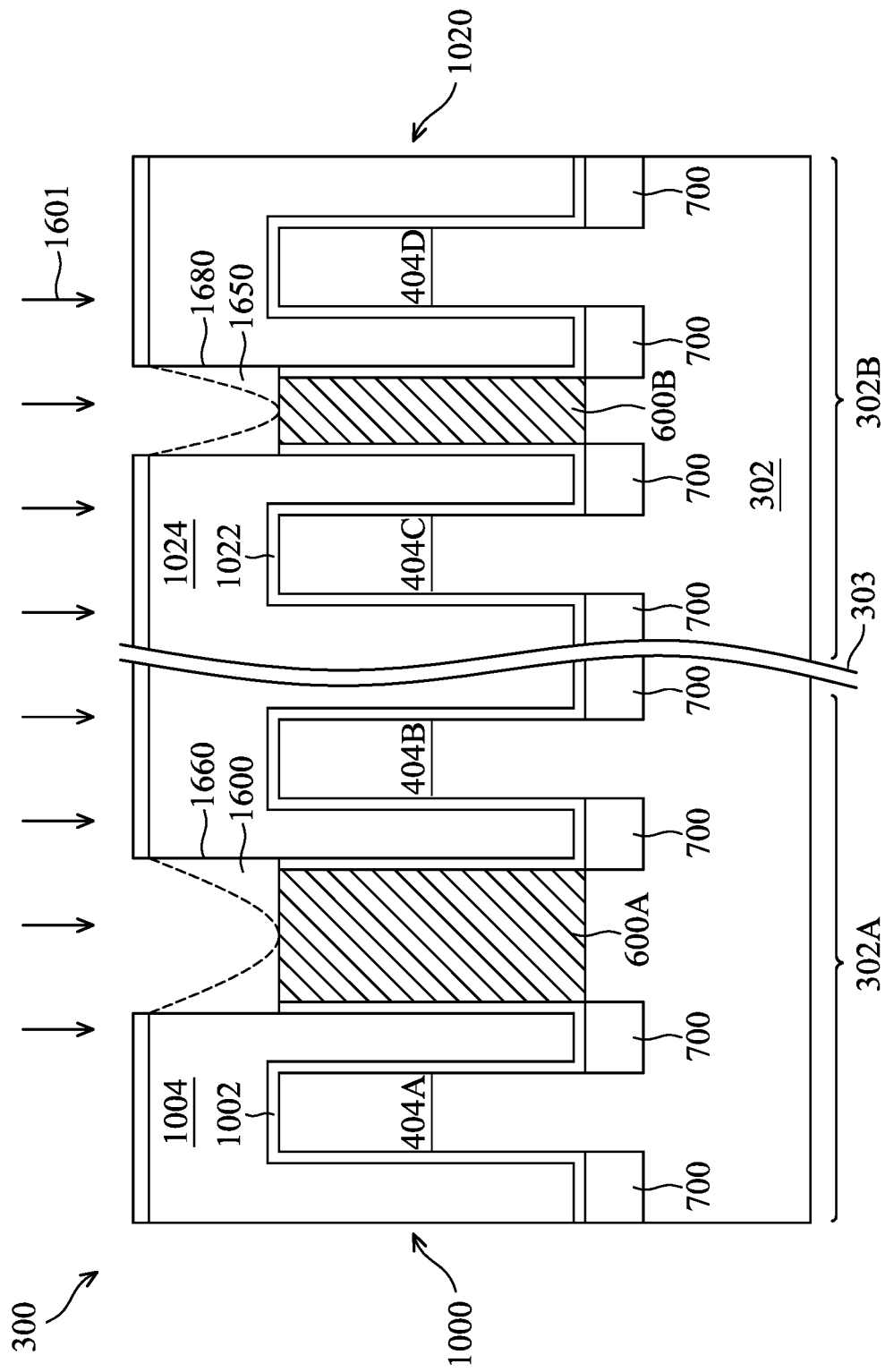

Still corresponding to operation 218 of FIG. 2, FIG. 16 is a cross-sectional view of the FinFET device 300 in which the dummy gate structures 1000 and 1020 are further cut to form a third portion of the gate cut trench 1600 in the I/O area 302A and a third portion of the gate cut trench 1650 in the core area 302B, respectively, at one of the various stages of fabrication.

To form the third portion of gate cut trench 1600 (hereinafter "third portion 1600"), a third stage of etching process 1601 (hereinafter "third stage 1601") may be performed to remove a portion of the dummy gate 1004 and a portion of the dummy gate dielectric 1002 that are disposed above the dummy fin 600A. Concurrently with forming the second portion 1600, the third stage 1601 may be performed to remove a portion of the dummy gate 1024 and a portion of the dummy gate dielectric 1022 that are disposed above the dummy fin 600B. During the third stage 1601, the mask 1403 may still be used to expose the respective portions of the dummy gates 1004 and 1024 desired to be removed (e.g., the portion disposed over the dummy fins 600A-B), followed by the second stage 1601.

In various embodiments, the third stage 1601 (of etching process) may be characterized with more isotropic etching than anisotropic etching. In other words, the third stage 1601 can laterally etch the dummy gate structures 1000 and 1020 more quickly than it vertically etches the dummy gate structures 1000 and 1020. As such, the third portions 1600 and 1650 may each extend the respective second portion (indicated by dotted lines) to present a U-shaped profile with an edge-based bottom surface and inner sidewalls, as illustrated in FIG. 16. In some embodiments, the dummy fins 600A and 600B may each serve as an etch stop layer, which causes the edge-based surface of the U-shaped profile to present around the top surfaces of the dummy fins 600A-B (as shown). In some other embodiments, the dummy gate dielectrics 1002 and 1022 may each serve as an etch stop layer, which causes the edge-based bottom surface of the U-shaped profile to present around the top surfaces of the dummy gate dielectrics 1002-1022 (not shown).

The third stage 1601 can include a plasma etching process. In such a plasma etching process (including radical plasma etching, remote plasma etching, and other suitable plasma etching processes), gas sources such as chlorine ($Cl_2$), hydrogen bromide (HBr), carbon tetrafluoride ($CF_4$), fluoroform ($CHF_3$), difluoromethane ($CH_2F_2$), fluoromethane ($CH_3F$), hexafluoro-1,3-butadiene ($C_4F_6$), boron trichloride ($BCl_3$), sulfur hexafluoride ($SF_6$), hydrogen ($H_2$), nitrogen trifluoride ($NF_3$), and other suitable gas sources and combinations thereof can be used with passivation gases such as nitrogen ($N_2$), oxygen ($O_2$), carbon dioxide ($CO_2$), sulfur dioxide ($SO_2$), carbon monoxide (CO), methane ($CH_4$), silicon tetrachloride ($SiCl_4$), and other suitable passivation gases and combinations thereof. Moreover, for the plasma etching process, the gas sources and/or the passivation gases can be diluted with gases such as argon (Ar), helium (He), neon (Ne), and other suitable dilutive gases and combinations thereof.

Figure 21:
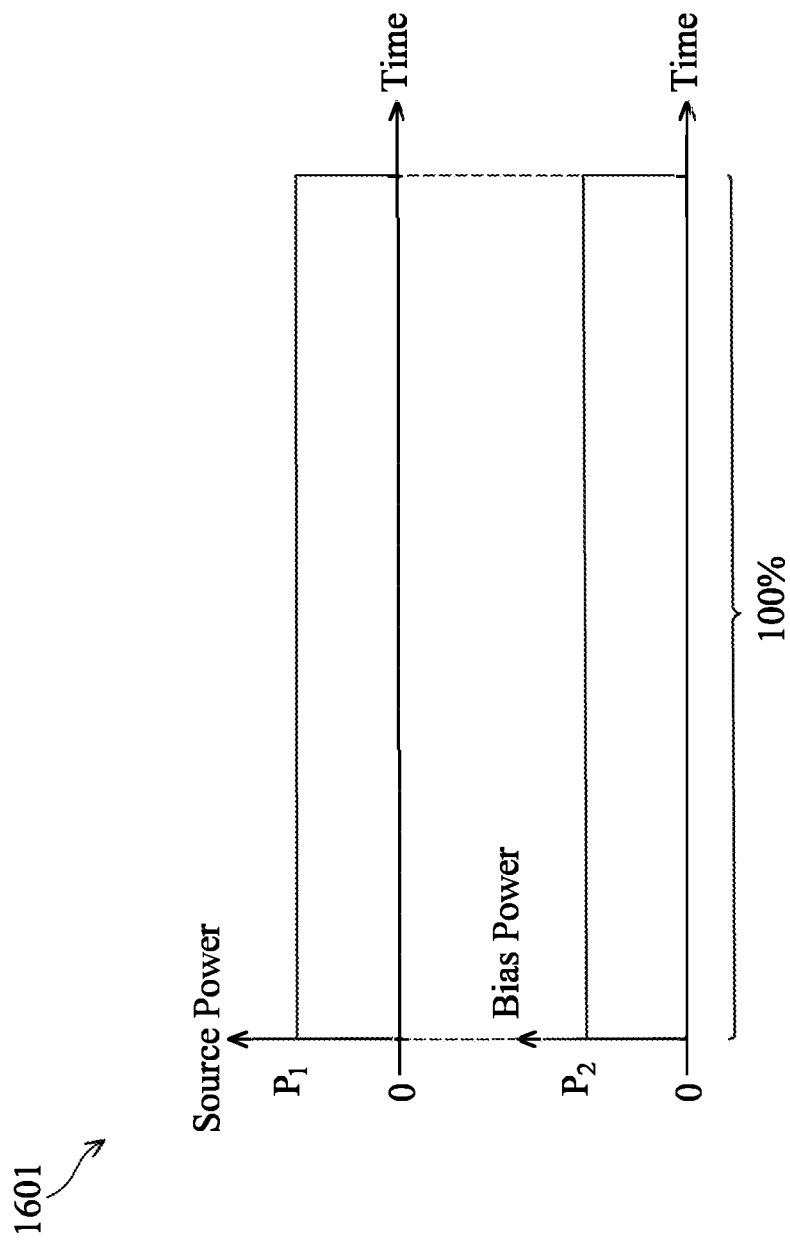
FIG. 21 illustrates an example timing diagram of yet another stage of the etching process performed in the method of FIG. 2, in accordance with some embodiments.

As a non-limiting example shown in FIG. 21, a timing diagram of the second stage 1601 is shown. In the third stage 1601, a source power $P_1$ (e.g., ranging from about 1100 watts to about 1400 watts) and a bias power $P_2$ (e.g., ranging from about 200 watts to 400 watts) may be applied throughout the whole third stage 1601, under a pressure of 1 millitorr to 5 torr and an etch gas flow of 0 standard cubic centimeters per minute to 5000 standard cubic centimeters per minute. As such (with a relatively higher bias power when compared to the first and second stages), the third stage 1601 may present a higher amount/extent of the isotropic etching than an amount of the anisotropic etching, which may further etch the curvature-based U-shaped second portion 1500/1550, laterally, to present the edge-based U-shaped profile of third portion 1600/1650. However, it is noted that source powers (and their applied time durations), bias powers, pressures (and their applied time durations), and flow rates outside of these ranges can also be contemplated, while remaining within the scope of the present disclosure.

In various embodiments, the first portion 1400, second portion 1500, and third portion 1600 may collectively form a gate cut trench 1660 over the dummy fin 600A in the I/O area 302A; and the first portion 1450, second portion 1550, and third portion 1650 may collectively form a gate cut trench 1680 over the dummy fin 600B in the core area 302B. As shown in FIG. 16, the gate cut trenches 1660 and 1680 each present an edge-based U-shaped profile. For example, the gate cut trench 1660 has an edge-based bottom surface and edge-based inner sidewalls connected to two ends of the bottom surface. Further, each of the inner sidewalls and the bottom surface form an angle that is approximately 90 degrees. As such, the distance between the inner sidewalls of the gate cut trench 1660 may remain constant. Similarly, the gate cut trench 1680 has an edge-based bottom surface and edge-based inner sidewalls connected to two ends of the bottom surface. Further, each of the inner sidewalls and the bottom surface form an angle that is approximately 90 degrees. As such, the distance between the inner sidewalls of the gate cut trench 1680 may remain constant.

Figure 17:
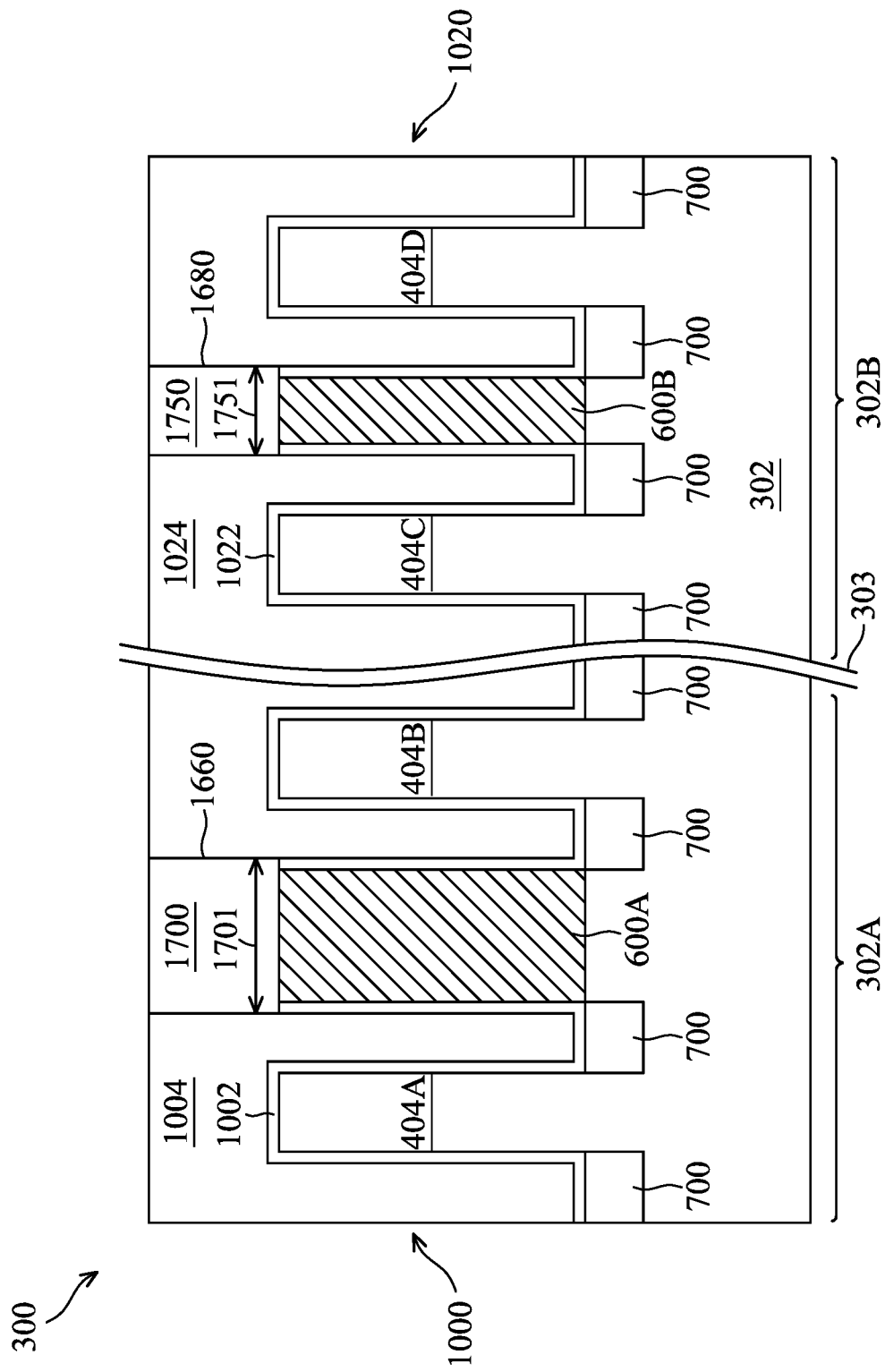

Corresponding to operation 220 of FIG. 2, FIG. 17 is a cross-sectional view of the FinFET device 300 including a gate isolation structure 1700 in the I/O area 302A and a gate isolation structure 1750 in the core area 302B at one of the various stages of fabrication. The cross-sectional view of FIG. 17 is cut along the lengthwise direction of the dummy gate structures 1000 and 1020 of the FinFET device 300 (e.g., cross-section B-B indicated in FIG. 1).

The gate isolation structures 1700 and 1750 are formed by filling the gate cut trenches 1660 and 1680, respectively, with a dielectric material. As such, the gate isolation structures 1700 and 1750 can inherit the profiles (or dimensions) of the gate cut trenches 1660 and 1680, respectively. For example, the gate isolation structure 1700 can have its sidewalls separated from each other by a distance (or a critical dimension) 1701, with a variation of about ±20%; and the gate isolation structure 1750 can have its sidewalls separated from each other by a distance (or a critical dimension) 1751, with a variation of about ±20%. In some embodiments, the critical dimension 1701 may be greater than the critical dimension 1751 by an amount that is determined based on a difference between the spacing 417 present between the active fins in the I/O area 302A and the spacing 419 present between the active fins in the core area 302B (FIG. 4). However, the variation of the critical dimension 1701 is about equal to the variation of the critical dimension 1751. For example, one of the variations of the critical dimensions 1701 and 1751 may vary within 5% of the other of the variations of the critical dimensions 1701 and 1751.

The dielectric material that is used to form the gate isolation structures 1700 and 1750 may include, for example, silicon oxide, silicon nitride, silicon oxynitride, silicon carbide, silicon carbonitride, silicon oxycarbonitride, silicon oxycarbide, or combinations thereof. The gate isolation structures 1700 and 1750 can be formed by depositing the dielectric material in the gate cut trenches 1660 and 1680, respectively, using any suitable method, such as CVD, PECVD, or FCVD. After the deposition, a CMP may be performed to remove any excess dielectric material from the remaining dummy gate structures 1000 and 1020.

Although the examples of FIG. 17 show that the gate isolation structures 1700 and 1750 respectively fill the gate cut trenches 1660 and 1680 with a single dielectric piece (which can include one or more dielectric materials listed above), it is understood that the gate isolation structures 1700 and 1750 can each include multiple pieces. Each of the pieces may include, for example, silicon oxide, silicon nitride, silicon oxynitride, silicon carbide, silicon carbonitride, silicon oxycarbonitride, silicon oxycarbide, or combinations thereof. For example, the gate isolation structures 1700 and 1750 may each include a first piece, which is formed as a conformal layer lining the respective gate cut trench, and a second piece, which fills the gate cut trench with the first piece coupled therebetween. In another example, the gate isolation structures 1700 and 1750 may each include a first piece, which fills a lower portion of the respective gate cut trench, and a second piece, which fills an upper portion of the gate cut trench.

Figure 18:
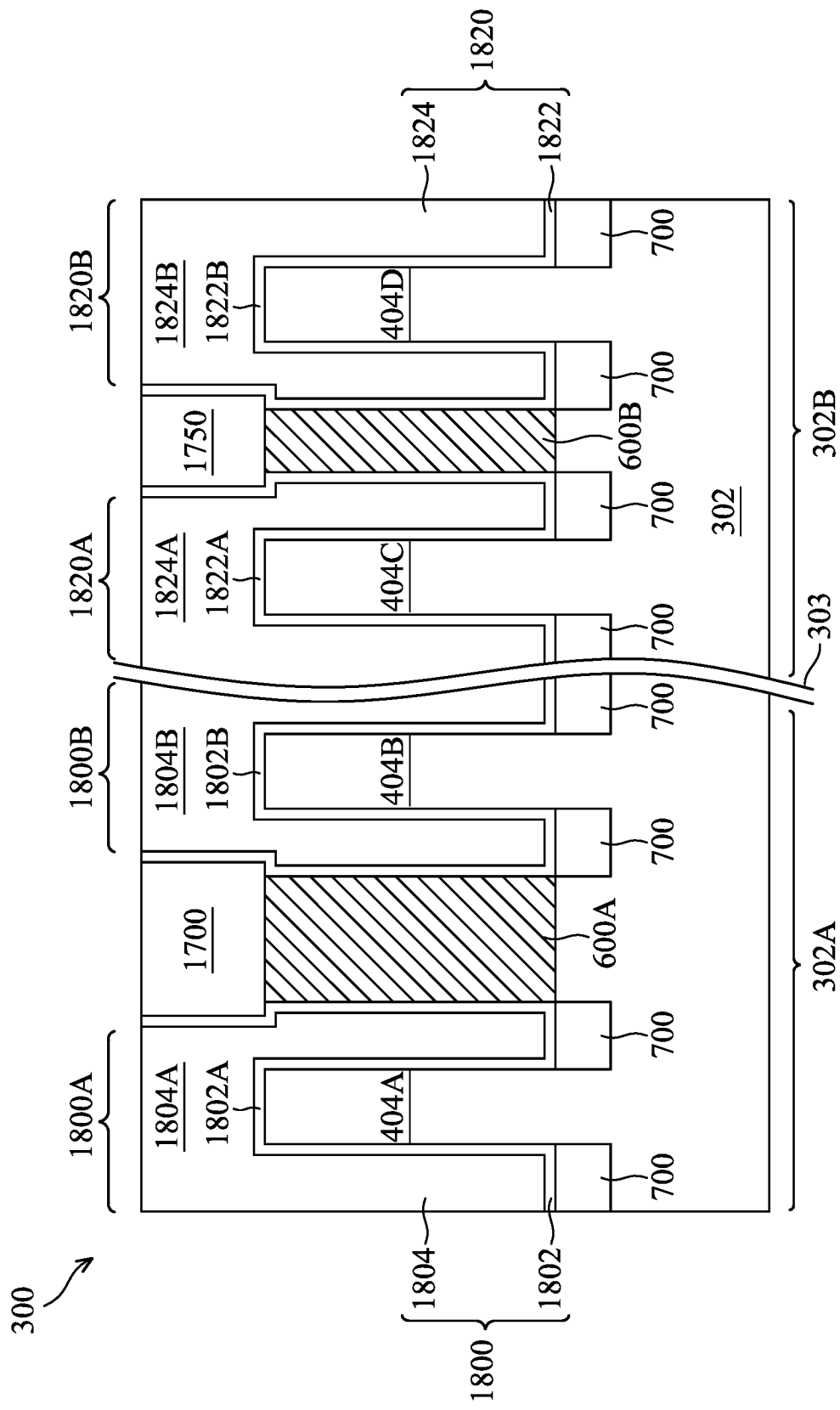

Corresponding to operation 222 of FIG. 2, FIG. 18 is a cross-sectional view of the FinFET device 300 including an active gate structure 1800 in the I/O area 302A and an active gate structure 1820 in the core area 302B at one of the various stages of fabrication. The cross-sectional view of FIG. 18 is cut along the lengthwise direction of the active gate structures 1800 and 1820 of the FinFET device 300 (e.g., cross-section B-B indicated in FIG. 1).

The active gate structure 1800 may be formed by replacing the dummy gate structure 1000; and the active gate structure 1820 may be formed by replacing the dummy gate structure 1020. As illustrated, the active gate structure 1800 may include two portions 1800A and 1800B that are separated by the gate isolation structure 1700 and the dummy fin 600A; and the active gate structure 1820 may include two portions 1820A and 1820B that are separated by the gate isolation structure 1750 and the dummy fin 600B. The portion 1800A can overlay the active fin 404A; the portion 1800B can overlay the active fin 404B; the portion 1820A can overlay the active fin 404C; and the portion 1820B can overlay the active fin 404D. After the active gate structures 1800 and 1820 are formed, the FinFET device 300 can include a number of transistors. For example, a first active transistor, adopting the active fin 404A as its conduction channel and portion 1800A as its active gate structure, may be formed; a second active transistor, adopting the active fin 404B as its conduction channel and portion 1800B as its active gate structure, may be formed; a third active transistor, adopting the active fin 404C as its conduction channel and portion 1820A as its active gate structure, may be formed; a fourth active transistor, adopting the active fin 404D as its conduction channel and portion 1820B as its active gate structure, may be formed. Further, the first and second transistors, formed in the I/O area 302A, may be each configured as an I/O transistor; and the third and fourth transistors, formed on the core area 302B, may be each configured as a core transistor.

The active gate structures 1800 and 1820 can each include a gate dielectric layer (e.g., 1802, 1822), a metal gate layer (1822, 1824), and one or more other layers that are not shown for clarity. For example, each of the active gate structures 1800 and 1820 may further include a capping layer and a glue layer. The capping layer can protect the underlying work function layer from being oxidized. In some embodiments, the capping layer may be a silicon-containing layer, such as a layer of silicon, a layer of silicon oxide, or a layer of silicon nitride. The glue layer can function as an adhesion layer between the underlying layer and a subsequently formed gate electrode material (e.g., tungsten) over the glue layer. The glue layer may be formed of a suitable material, such as titanium nitride.

The gate dielectric layers 1802 and 1822 are each deposited (e.g., conformally) in a corresponding gate trench to surround (e.g., straddle) one or more fins. For example in FIG. 18, the gate dielectric layer of the portion 1800A (sometimes referred to as "gate dielectric layer 1802A") is deposited in a gate trench that is formed by removing a portion of the dummy gate structure 1000 (e.g., the remaining dummy gate dielectric 1102 and dummy gate 1104) on the left-hand side of the dummy fin 600A. The gate dielectric layer 1802A can overlay the top surfaces and the sidewalls of the active fin 404A, one of the sidewalls of the dummy fin 600A, and one of the sidewalls of the gate isolation structure 1700. The gate dielectric layer of the portion 1800B (sometimes referred to as "gate dielectric layer 1802B") is deposited in a gate trench that is formed by removing a portion of the dummy gate structure 1000 (e.g., the remaining dummy gate dielectric 1002 and dummy gate 1004) on the right-hand side of the dummy fin 600A. The gate dielectric layer 1802B can overlay the top surfaces and the sidewalls of the active fin 404B, the other of the sidewalls of the dummy fin 600A, and the other of the sidewalls of the gate isolation structure 1700. The gate dielectric layer of the portion 1820A (sometimes referred to as "gate dielectric layer 1822A") is deposited in a gate trench that is formed by removing a portion of the dummy gate structure 1020 (e.g., the remaining dummy gate dielectric 1022 and dummy gate 1024) on the left-hand side of the dummy fin 600B. The gate dielectric layer 1822A can overlay the top surfaces and the sidewalls of the active fin 404C, one of the sidewalls of the dummy fin 600B, and one of the sidewalls of the gate isolation structure 1750. The gate dielectric layer of the portion 1820B (sometimes referred to as "gate dielectric layer 1822B") is deposited in a gate trench that is formed by removing a portion of the dummy gate structure 1020 (e.g., the remaining dummy gate dielectric 1022 and dummy gate 1024) on the right-hand side of the dummy fin 600B. The gate dielectric layer 1822B can overlay the top surfaces and the sidewalls of the active fin 404D, the other of the sidewalls of the dummy fin 600B, and the other of the sidewalls of the gate isolation structure 1750.

The gate dielectric layers 1802 and 1822 each include silicon oxide, silicon nitride, or multilayers thereof. In example embodiments, the gate dielectric layers 1802 and 1822 each include a high-k dielectric material, and in these embodiments, the gate dielectric layers 1802 and 1822 may each have a k value greater than about 7.0, and may include a metal oxide or a silicate of Hf, Al, Zr, La, Mg, Ba, Ti, Pb, or combinations thereof. The formation methods of the gate dielectric layers 1802 and 1822 may include molecular beam deposition (MBD), atomic layer deposition (ALD), PECVD, and the like. A thickness of each of the gate dielectric layers 1802 and 1822 may be between about 8 angstroms (Å) and about 20 Å, as an example.

The metal gate layers 1804 and 1827 may each be formed over the respective gate dielectric layer. The metal gate layer of the portion 1800A (sometimes referred to as "metal gate layer 1804A") is deposited in the gate trench over the gate dielectric layer 1802A; the metal gate layer of the portion 1800B (sometimes referred to as "metal gate layer 1804B") is deposited in the gate trench over the gate dielectric layer 1802B; the metal gate layer of the portion 1820A (sometimes referred to as "metal gate layer 1824A") is deposited in the gate trench over the gate dielectric layer 1822A; and the metal gate layer of the portion 1820B (sometimes referred to as "metal gate layer 1824B") is deposited in the gate trench over the gate dielectric layer 1822B.

The metal gate layers 1804 and 1824 may each be a P-type work function layer, an N-type work function layer, multi-layers thereof, or combinations thereof, in some embodiments. Accordingly, the metal gate layers 1804 and 1824 may each be referred to as a work function layer, in some embodiments. In the discussion herein, a work function layer may also be referred to as a work function metal. Example P-type work function metals that may be included in the gate structures for P-type devices include TiN, TaN, Ru, Mo, Al, WN, $ZrSi_2$, $MoSi_2$, $TaSi_2$, $NiSi_2$, WN, other suitable P-type work function materials, or combinations thereof. Example N-type work function metals that may be included in the gate structures for N-type devices include Ti, Ag, TaAl, TaAlC, TiAlN, TaC, TaCN, TaSiN, Mn, Zr, other suitable N-type work function materials, or combinations thereof.

A work function value is associated with the material composition of the work function layer, and thus, the material of the work function layer is chosen to tune its work function value so that a target threshold voltage $V_t$ is achieved in the device that is to be formed. The work function layer(s) may be deposited by CVD, physical vapor deposition (PVD), ALD, and/or other suitable process. The thickness of a P-type work function layer may be between about 8 Å and about 15 Å, and the thickness of an N-type work function layer may be between about 15 Å and about 30 Å, as an example.

In one aspect of the present disclosure, a method for making a semiconductor device is disclosed. The method includes forming a first semiconductor fin and a second semiconductor fin over a substrate that both extend along a first direction. The method includes forming a dielectric fin that extends along the first direction and is disposed between the first and second semiconductor fins. The method includes forming a dummy gate structure that extends along a second direction perpendicular to the first direction and straddles the first and second semiconductor fins and the dielectric fin. The method includes removing a portion of the dummy gate structure over the dielectric fin to form a trench by performing an etching process that includes a plurality of stages. Each of the plurality of stages includes a combination of anisotropic etching and isotropic etching such that a variation of a distance between respective inner sidewalls of the trench along the second direction is within a threshold. The method includes filling the trench with a dielectric material to form a gate isolation structure.

In another aspect of the present disclosure, a method for making a semiconductor device is disclosed. The method includes forming a first semiconductor fin and a second semiconductor fin over a first area of a substrate. The method includes forming a third semiconductor fin and a fourth semiconductor fin over a second area of the substrate. A first density of transistors formed in the first area is greater than a second density of transistors formed in the second area. The method includes forming a first dielectric fin disposed between the first and second semiconductor fins. The method includes forming a second dielectric fin disposed between the third and fourth semiconductor fins. The method includes forming a first dummy gate structure that straddles the first and second semiconductor fins and the first dielectric fin. The method includes forming a second dummy gate structure that straddles the third and fourth semiconductor fins and the second dielectric fin. The method includes concurrently removing a portion of the first dummy gate structure over the first dielectric fin to form a first trench and removing a portion of the second dummy gate structure over the second dielectric fin to form a second trench by performing an etching process that includes a plurality of stages. Each of the plurality of stages includes a combination of anisotropic etching and isotropic etching such that a first variation of a first distance between respective inner sidewalls of the first trench and a second variation of a second distance between respective inner sidewalls of the second trench are each within a threshold. The method includes filling the first and second trenches with a dielectric material to respectively form a first gate isolation structure and a second gate isolation structure.

In yet another aspect of the present disclosure, a semiconductor device is disclosed. The semiconductor device includes a first plurality of transistors and a second plurality of transistors. The first plurality of transistors are configured to operate under a lower gate voltage than the second plurality of transistors. The first plurality of transistors comprise a first transistor having a first active gate structure and a second transistor having a second active gate structure, the first and second active gate structures being separated from each other by a first gate isolation structure along a first direction. The second plurality of transistors comprise a third transistor having a third active gate structure and a fourth transistor having a fourth active gate structure, the third and fourth active gate structures being separated from each other by a second gate isolation structure along the first direction. A first variation of a first distance between respective sidewalls of the first gate isolation structure along the first direction is about equal to a second variation of a second distance between respective sidewalls of the second gate isolation structure along the first direction, and wherein the first and second variations each range from about −20% to about 20%.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of making a semiconductor device, comprising:
   forming a first semiconductor fin and a second semiconductor fin over a substrate that both extend along a first direction;
   forming a dielectric fin that extends along the first direction and is disposed between the first and second semiconductor fins;
   forming a dummy gate structure that extends along a second direction perpendicular to the first direction and straddles the first and second semiconductor fins and the dielectric fin;
   removing a portion of the dummy gate structure over the dielectric fin to form a trench by performing an etching process that includes a plurality of stages, wherein each of the plurality of stages includes a combination of anisotropic etching and isotropic etching such that a variation of a distance between inner sidewalls of the trench along the second direction is within a threshold, wherein the inner sidewalls of the trench face each other along the second direction; and
   filling the trench with a dielectric material to form a gate isolation structure;
   wherein the plurality of stages comprises:
   a first stage configured to form a first portion of the trench in a valley-shaped profile;
   a second stage configured to form a second portion of the trench in a curvature-based U-shaped profile; and
   a third stage configured to form a third portion of the trench in an edge-based U-shaped profile.

2. The method of claim 1, wherein the first stage is configured to vertically etch the dummy gate structure more quickly than to laterally etch the dummy gate structure.

3. The method of claim 2, wherein the first stage includes a plasma etching process, in which a source power and a bias power are both applied during a first period of time of the first stage, and the source power is maintained and the bias power is turned off during a second period of time of the first stage.

4. The method of claim 3, wherein the first period of time is longer than the second period of time.

5. The method of claim 1, wherein the second stage is configured to both vertically and laterally etch the dummy gate structure.

6. The method of claim 5, wherein the second stage includes a plasma etching process, in which a source power and a bias power are both applied during a first period of time of the second stage, the source power is reduced and the bias power is turned off during a second period of time of the second stage, and the source power is turned off and the bias power is turned on again during a third period of time of the second stage, and wherein the first period of time is shorter than the second period of time and the second period of time is shorter than the third period of time.

7. The method of claim 6, wherein the third period of time is greater than the second period of time, and the second period of time is greater than the first period of time.

8. The method of claim 1, wherein the third stage is configured to laterally etch the dummy gate structure more quickly than to vertically etch the dummy gate structure.

9. The method of claim 8, wherein the third stage includes a plasma etching process, in which a source power and a bias power are both applied throughout the third stage.

10. The method of claim 1, wherein the threshold is less than about 20%.

11. The method of claim 1, further comprising replacing a remaining portion with an active gate structure, wherein the active gate structure includes different portion separated by the gate isolation structure.

12. A method of making a semiconductor device, comprising:
forming a first semiconductor fin and a second semiconductor fin over a first area of a substrate;
forming a third semiconductor fin and a fourth semiconductor fin over a second area of the substrate, wherein a first density of transistors formed in the first area is greater than a second density of transistors formed in the second area;
forming a first dielectric fin disposed between the first and second semiconductor fins;
forming a second dielectric fin disposed between the third and fourth semiconductor fins;
forming a first dummy gate structure that straddles the first and second semiconductor fins and the first dielectric fin;
forming a second dummy gate structure that straddles the third and fourth semiconductor fins and the second dielectric fin;
concurrently removing a portion of the first dummy gate structure over the first dielectric fin to form a first trench and removing a portion of the second dummy gate structure over the second dielectric fin to form a second trench by performing an etching process that includes a plurality of stages, wherein each of the plurality of stages includes a combination of anisotropic etching and isotropic etching such that a first variation of a first distance between respective inner sidewalls of the first trench and a second variation of a second distance between respective inner sidewalls of the second trench are each within a threshold; and
filling the first and second trenches with a dielectric material to respectively form a first gate isolation structure and a second gate isolation structure.

13. The method of claim 12, wherein second distance is greater than the first distance.

14. The method of claim 12, wherein the plurality of stages comprise:
a first stage configured to form a first portion of each of the first and second trenches in a valley-shaped profile;
a second stage configured to form a second portion of each of the first and second trenches in a curvature-based U-shaped profile; and
a third stage configured to form a third portion of each of the first and second trenches in an edge-based U-shaped profile.

15. The method of claim 14, wherein the first stage includes a plasma etching process, in which a source power and a bias power are both applied during a first period of time of the first stage, and the source power is maintained and the bias power is turned off during a second period of time of the first stage.

16. The method of claim 14, wherein the second stage includes a plasma etching process, in which a source power and a bias power are both applied during a first period of time of the second stage, the source power is reduced and the bias power is turned off during a second period of time of the second stage, and the source power is turned off and the bias power is turned on again during a third period of time of the second stage, and wherein the first period of time is shorter than the second period of time and the second period of time is shorter than the third period of time.

17. The method of claim 14, wherein the third stage includes a plasma etching process, in which a source power and a bias power are both applied throughout the third stage.

18. The method of claim 12, wherein the threshold is less than about 20%.

19. A method of making a semiconductor device, comprising:
forming a first semiconductor fin and a second semiconductor fin over a substrate that both extend along a first direction;
forming a dielectric fin that extends along the first direction and is disposed between the first and second semiconductor fins;
forming a dummy gate structure that extends along a second direction perpendicular to the first direction and straddles the first and second semiconductor fins and the dielectric fin;
removing a portion of the dummy gate structure over the dielectric fin to form a trench by performing a first etching process, a second etching process, and a third etching process, wherein the first etching process is configured to form a first portion of the trench in a valley-shaped profile, the second etching process is configured to form a second portion of the trench in a curvature-based U-shaped profile, and the third etching process is configured to form a third portion of the trench in an edge-based U-shaped profile; and
filling the trench with a dielectric material to form a gate isolation structure.

20. The method of claim 19, wherein each of the first to third etching processes includes a combination of anisotropic etching and isotropic etching such that a variation of a distance between inner sidewalls of the trench along the second direction is within a threshold, wherein the inner sidewalls of the trench face each other along the second direction.

* * * * *